United States Patent

Park

[11] Patent Number: 6,066,524
[45] Date of Patent: May 23, 2000

[54] METHOD FOR FABRICATING SRAM CELL

[75] Inventor: Joon Young Park, Chungcheongbuk-do, Rep. of Korea

[73] Assignee: LG Semicon Co., Ltd., Chungcheongbuk-Do, Rep. of Korea

[21] Appl. No.: 09/066,683

[22] Filed: Apr. 28, 1998

[30] Foreign Application Priority Data

May 13, 1997 [KR] Rep. of Korea ............... 97-18422

[51] Int. Cl.[7] ........................... H01L 21/8244
[52] U.S. Cl. ........................... 438/238; 438/384
[58] Field of Search ................. 438/238–241, 438/381–385

[56] References Cited

U.S. PATENT DOCUMENTS 5,824,579  10/1998  Subramanian et al. ............ 438/238
5,939,760   8/1999  Batra et al. ..................... 438/238

OTHER PUBLICATIONS

Shuji Ikeda et al., "A Stacked Split Word–Line (SSW) Cell for Low Voltage Operation, Large Capacity, High Speed SRAMs", IEDM, 1993, pp. 809–812.

Primary Examiner—Jey Tsai
Attorney, Agent, or Firm—Morgan, Lewis & Bockius LLP

[57] ABSTRACT

An SRAM cell and method for fabricating the same including first and second access transistors, first and second drive transistors, and first and second load resistors. A first terminal of the first access transistor, a gate terminal of the second drive transistor, and a first load resistor terminal are connected to one another to form a first cell node terminal. A first terminal of the second access transistor, a gate terminal of the first drive transistor, and a second load resistor terminal are connected to one another to form a second cell node terminal. The SRAM cell includes a gate electrode of each of the first and second drive transistors arranged over a semiconductor substrate in a first direction, and a gate electrode of each of the first and second access transistors arranged in the first direction overlapped with portions of the gate electrodes of the first and second drive transistors.

12 Claims, 26 Drawing Sheets

//...

METHOD FOR FABRICATING SRAM CELL

BACKGROUND OF THE INVENTION

1. Field of the Invention

The present invention relates to a semiconductor memory device and a method for fabricating the same, and more particularly, to an SRAM (Static Random Access Memory) cell and a method for fabricating the same.

2. Discussion of the Related Art

In general, the SRAM cell consists either four transistors (for example, 2 access transistors and 2 drive transistors) and 2 polysilicon load resistors or 6 transistors. In particular, a highly integrated cell of 4M class and over has 6 transistors in the form of CMOS including, in general, 4 NMOS transistors and 2 PMOS transistors. In an SRAM cell of lower integration, an asymmetrical cell is used, which is favorable in view of the occupied area. As the cell becomes highly integrated with a reduction of the occupied area, in which the asymmetry significantly affects the performance of the cell, a symmetrical cell becomes essential. However, with symmetry, a bit area becomes larger for the same line width. Accordingly, a current major interest is to reduce the area while maintaining the symmetry.

FIG. 1 illustrates an equivalent circuit of a conventional CMOS SRAM cell. As shown, the conventional SRAM cell includes 4 NMOS transistors Q1~Q4 formed on a semiconductor substrate and 2 PMOS transistors Q5 and Q6 formed on the NMOS transistors as thin film transistors.

A conventional method for fabricating the SRAM cell having the aforementioned system will be explained with reference to the attached drawings. FIG. 2a illustrates a plan view showing an arrangement of bulk transistors in the conventional SRAM cell. FIG. 2b illustrates a plan view showing an arrangement of thin film transistors in the conventional SRAM cell. FIG. 3 illustrates a plan view showing an arrangement of the thin film transistors in FIG. 2b over the bulk transistors in FIG. 2a in the conventional SRAM cell. FIG. 4 illustrates a section of the conventional SRAM cell across a line IV—IV in FIG. 3. FIG. 5 illustrates a section of the conventional SRAM cell across a line V—V in FIG. 3.

Referring to the drawings, in the conventional method for fabricating an SRAM, a semiconductor substrate 31 is provided, and active regions 32 and field regions 32a are defined on the semiconductor substrate 31. A first gate oxide film 33 is formed on each of the active regions 32. A first polysilicon and a cap gate nitride film 34 are formed in succession on the first gate oxide film 33 and photoetched to define a first gate electrode 35 of a bulk transistor. Sidewall oxide films 37 are formed on both sides of the first gate electrodes 35. The first gate electrode 35 and the sidewall oxide films 37 on both sides thereof are used as masks in injecting impurity ions to form first and second impurity regions 39 and 41 in the active regions 32. A first interlayer insulating film 43 is formed on the entire surface over the semiconductor substrate 31 and etched to open a predetermined portion of the semiconductor substrate 31. A second polysilicon is deposited on the first interlayer insulating film 43 to be in contact with the first impurity region 39 to form a Vss line 44. Then, a second interlayer insulating film 45 and a third polysilicon are formed in succession on the Vss line 44. The third polysilicon is patterned with a photoetching process to form a second gate electrode 46 of the thin film transistor. A second gate oxide film 47 and fourth polysilicon are formed on the semiconductor substrate 31, and an offset mask 48 is covered thereon. P type impurities are doped on the offset mask 48 to form a body 49 of a thin film transistor having source, drain and channel regions. In order to improve a transistor performance, heat treatment is carried out to increase the grain sizes. The SRAM cell is completed when processed through exposure, etching, and wiring. That is, an insulating film 50 is formed on the entire surface inclusive of the body 49 of the thin film transistor, and a contact hole to expose a surface of the first impurity region 39 is formed. Then, a metal wiring 51 is formed on the entire surface inclusive of the contact hole.

However, the aforementioned conventional SRAM cell and method for fabricating the same have the following problems. First, the asymmetry of the drive transistors and access transistors places a limitation on the reduction of a cell size. Second, the difference in the channel directions of the drive transistors and access transistors complicates the fabrication process of the memory cell. Third, the spaced formation with certain intervals and a connection of the gates to one another in a later fabrication process of the access transistors causes the cell to have a larger area.

SUMMARY OF THE INVENTION

Accordingly, the present invention is directed to an SRAM cell and a method for fabricating the same that substantially obviates one or more of the problems due to limitations and disadvantages of the related art.

An object of the invention is to provide an SRAM cell having a small cell size.

Another object of the invention is to provide an SRAM cell having a less complicated fabricating process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the SRAM cell having first and second access transistors, first and second drive transistors and first and second load resistors, wherein a first terminal of the first access transistor, a gate terminal of the second drive transistor and a first load resistor terminal are connected to one another to form a first cell node terminal, and a first terminal of the second access transistor, a gate terminal of the first drive transistor and a second load resistor terminal are connected to one another to form a second cell node terminal, the SRAM cell includes a gate electrode of each of the first, and second drive transistors arranged over a semiconductor substrate in a first direction, and a gate electrode of each of the first, and second access transistors arranged in the first direction overlapped with portions of the gate electrodes of the first, and second drive transistors.

In another aspect of the present invention, there is provided a method for fabricating an SRAM cell, the SRAM cell having first and second access transistors, first and second drive transistors and first and second load resistors, wherein a first terminal of the first access transistor, a gate terminal of the second drive transistor and a first load resistor terminal are connected to one another to form a first cell node terminal, and a first terminal of the second access transistor, a gate terminal of the first drive transistor and a second load resistor terminal are connected to one another to form a second cell node terminal, the method including the steps of forming the first, and second drive transistors each having impurity regions and a gate, forming the first, and second access transistors each having impurity regions and gates formed overlapped with portions of, and in parallel to gates of the first, and second drive transistors, forming an insulating film having contact holes to the impurity regions of the first, and second drive transistors, and forming the first, and second load resistors on the insulating film connected to the impurity regions of the first, and second drive transistors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
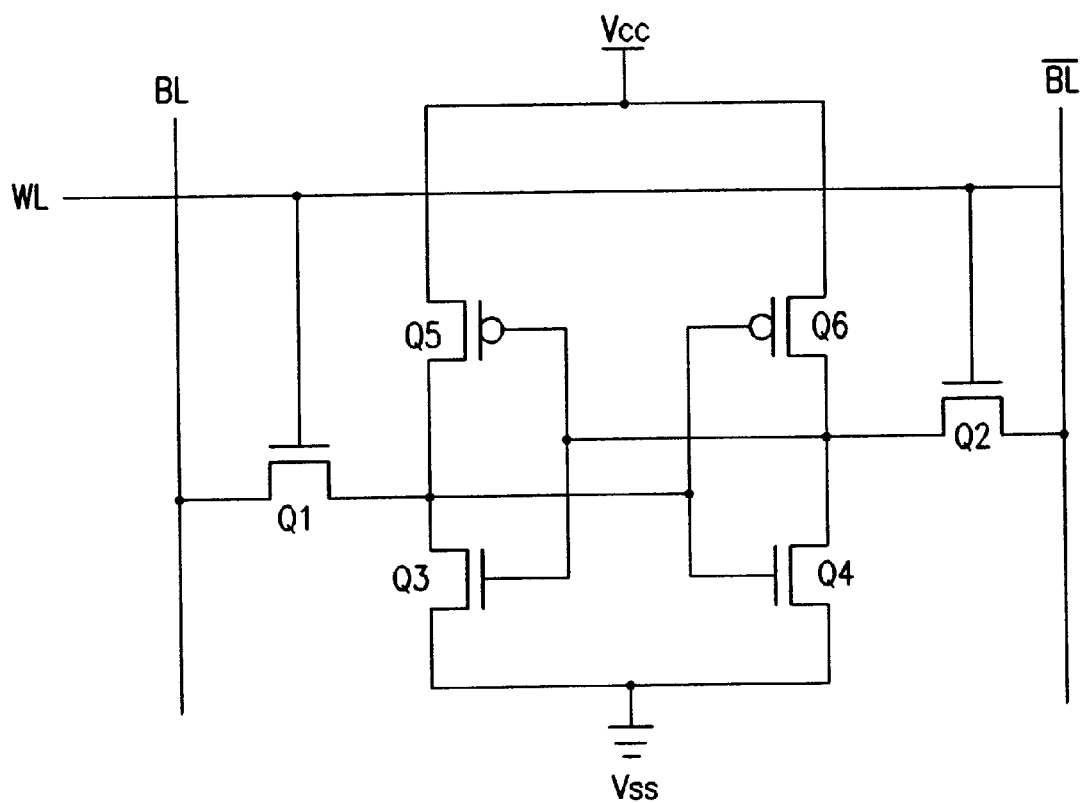
FIG. 1 illustrates an equivalent circuit of a conventional SRAM cell of a CMOS form.
Figure 2A:
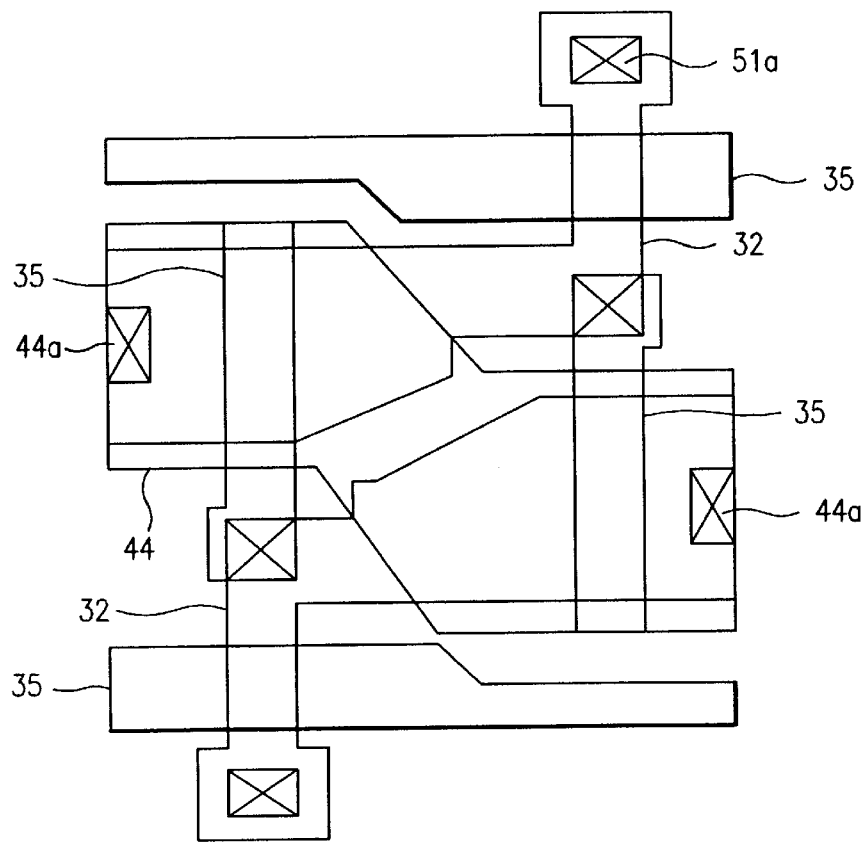
FIG. 2a illustrates a plan view showing an arrangement of bulk transistors in the conventional SRAM cell.
Figure 2B:
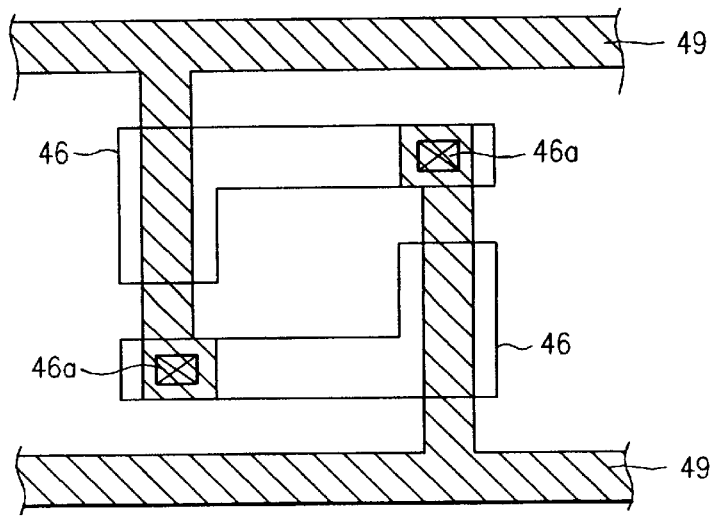
FIG. 2b illustrates a plan view showing an arrangement of thin film transistors in the conventional SRAM cell.
Figure 3:
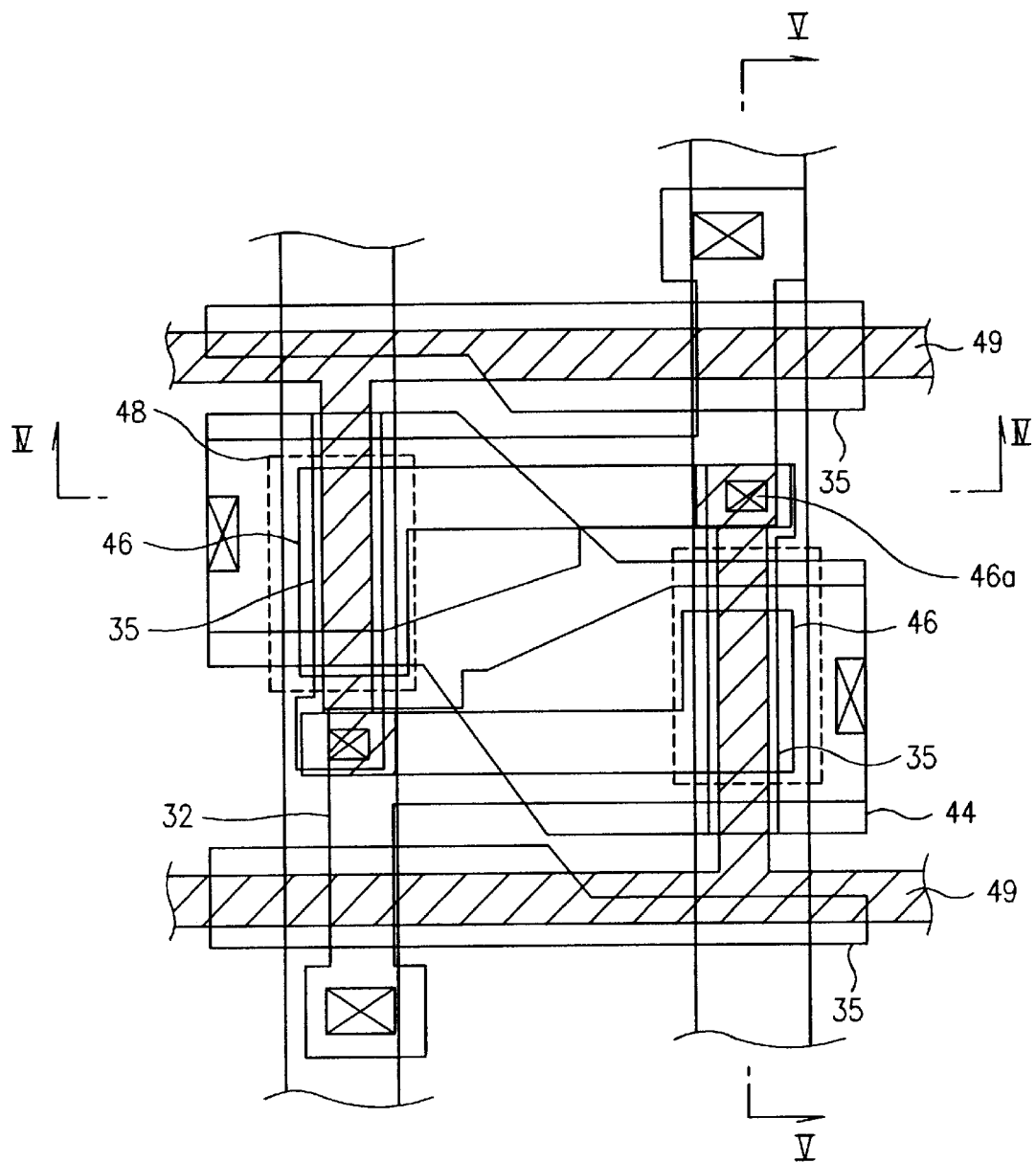
FIG. 3 illustrates a plan view showing an arrangement of the thin film transistors in FIG. 2b over the bulk transistors in FIG. 2a in the conventional SRAM cell.
Figure 4:
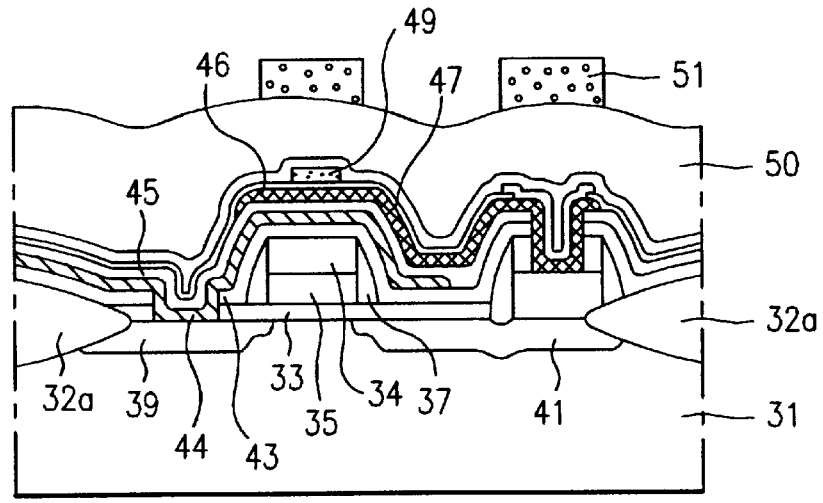
FIG. 4 illustrates a section of the conventional SRAM cell across a line IV—IV in FIG. 3.
Figure 5:
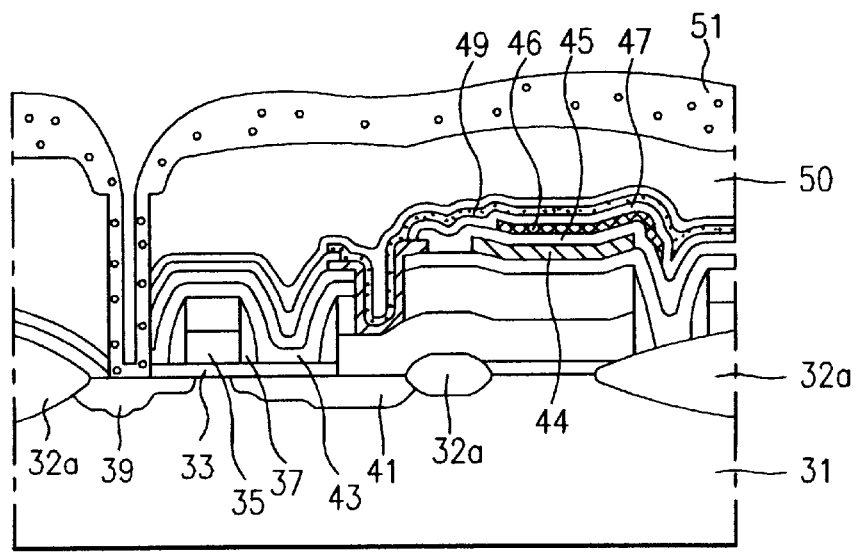
FIG. 5 illustrates a section of the conventional SRAM cell across a line V—V in FIG. 3.
Figure 6:
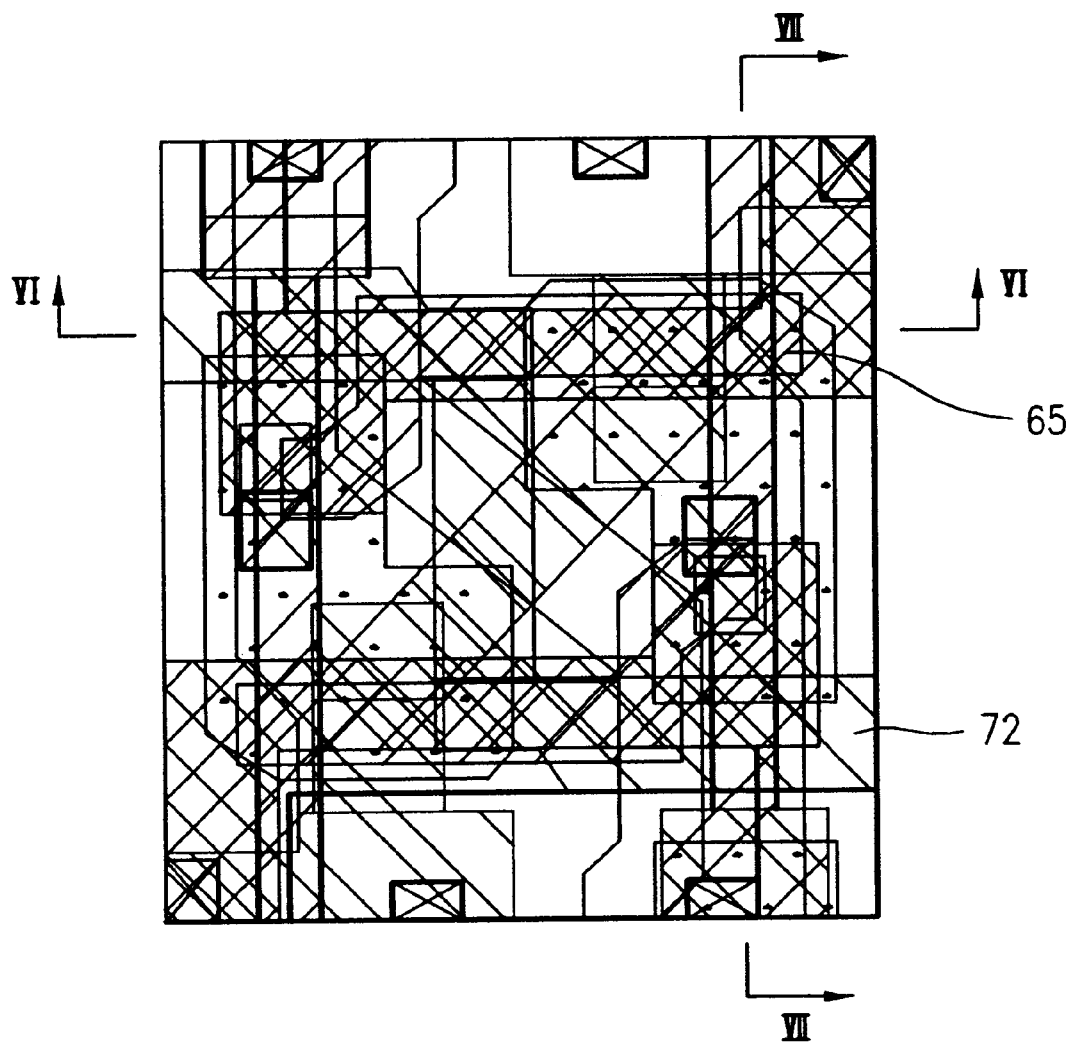
FIG. 6 illustrates a plan view of an SRAM cell in accordance with a preferred embodiment of the present invention.
Figure 7:
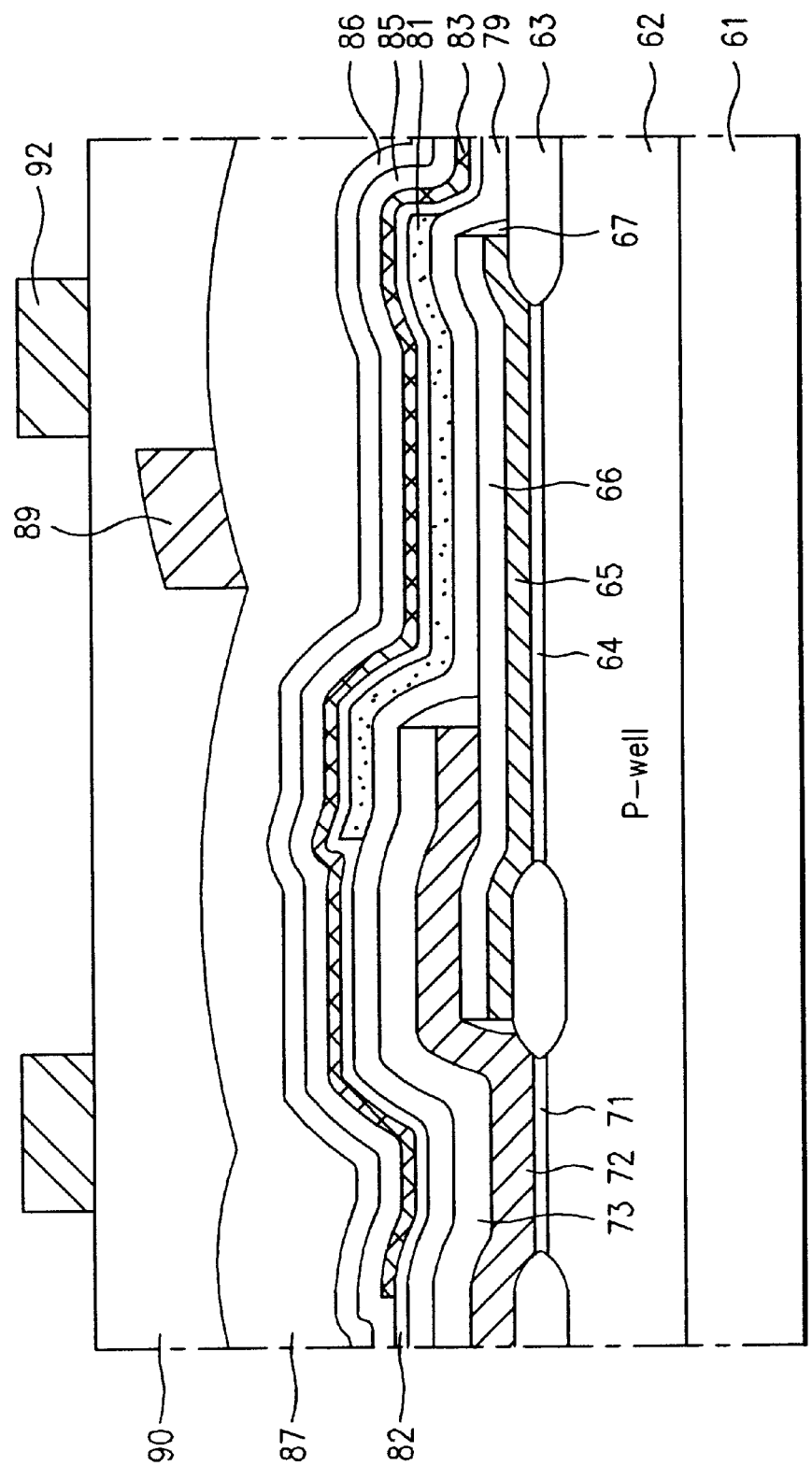
FIG. 7 illustrates a section of the SRAM cell across a line VI—VI in FIG. 6.
Figure 8:
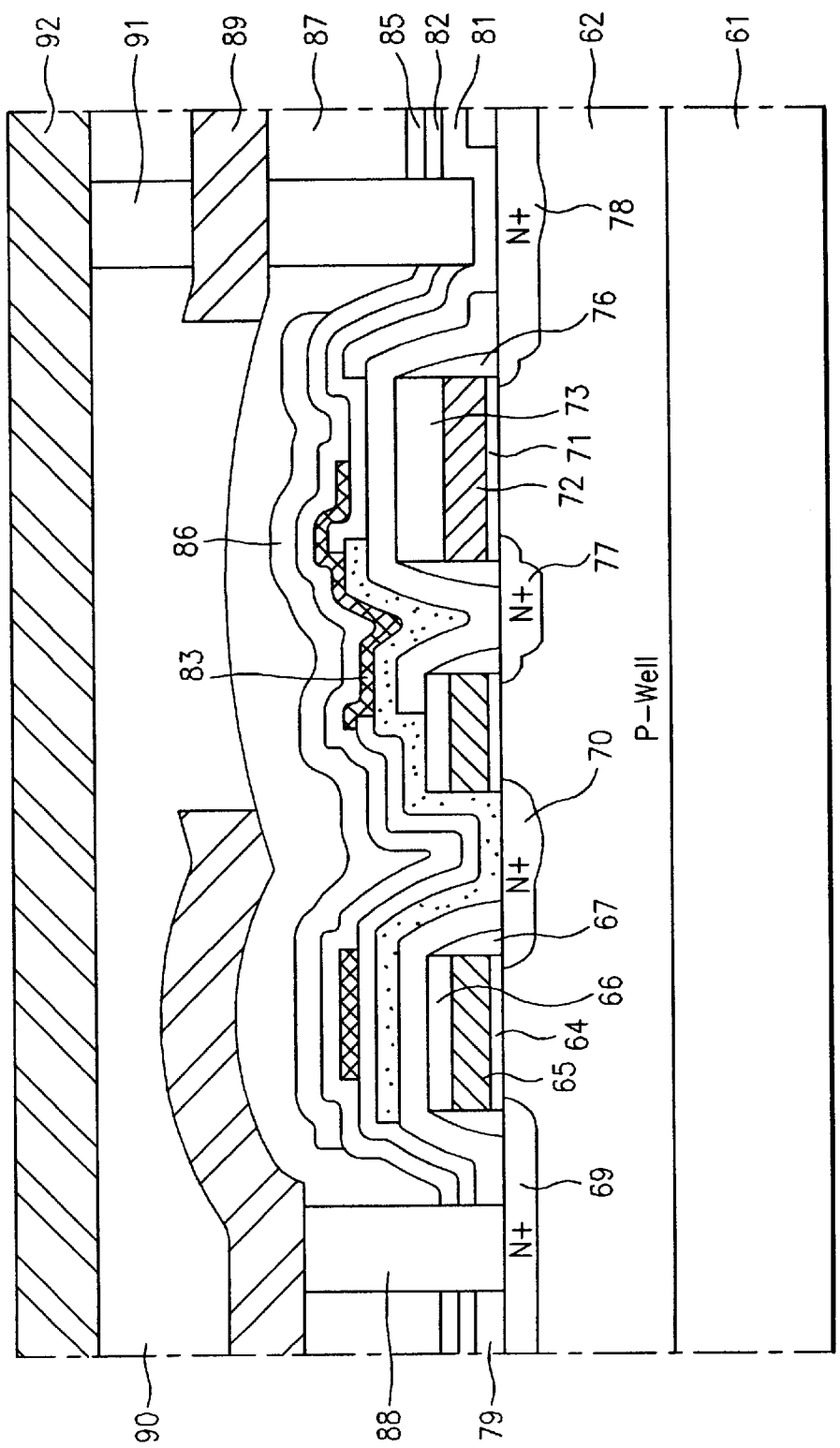
FIG. 8 illustrates a section of the SRAM cell across a line VII—VII in FIG. 6.

FIG. 6 illustrates a plan view of an SRAM cell in accordance with a preferred embodiment of the present invention, FIG. 7 illustrates a section of the SRAM cell across a line VI—VI in FIG. 6, and FIG. 8 illustrates a section of the SRAM cell across a line VII—VII in FIG. 6.

Referring to FIGS. 6, 7 and 8, the SRAM cell in accordance with a preferred embodiment of the present invention includes a p-well 62 formed on the surface of an n type semiconductor substrate 61, active regions formed in the p-well 62 spaced apart by a certain distance from each other and isolated by field oxide films 63, and two drive transistors formed spaced apart by a certain distance on the active regions and the field regions 63. Each of the drive transistors includes a first gate insulating film 64, a first gate electrode 65, a first cap oxide film 66, and first and second impurity regions 69 and 70 as source/drain regions at surface portions of the p-well 62 on both sides of the first gate electrode 65. The first gate electrode 65 has first sidewall oxide films 67 formed at both sides thereof. Each of the access transistors includes a second gate insulating film 71, a second gate electrode 72, a second cap oxide film 73, and third and fourth impurity regions 77 and 78 as source drain regions of LDD structures formed at surface portions of the p-well 62 on both sides of the second gate electrode 72. The second gate electrode 72 has second sidewall oxide films 76 formed at both sides thereof. The second gate electrode 72 for each of two access transistors are preferably formed in the same direction as the first gate electrodes 65 of the two drive transistors and overlaps a portion of the gate electrode 65. The drive transistors and the access transistors are preferably formed to have the same channel direction and rectangular shapes.

There is a third oxide film 79 formed on the entire surface of the semiconductor substrate 61 inclusive of the drive transistors and the access transistors such that a portion of a surface of each of the second and fourth impurity regions 70 and 78 are open or exposed. A third gate electrode 81 of a thin film transistor formed of polysilicon contacts the exposed second and fourth impurity regions 70 and 78. A fourth oxide film 82 is formed on the entire surface of the semiconductor substrate 61 inclusive of the third gate electrode 81 while exposing the third gate electrode 81 and a portion of a surface of the third oxide film 79. A body 83 of the thin film transistor is used as a channel region, source region, and drain region of the thin film transistor and formed selectively on the exposed third gate electrode 81 and the fourth oxide film 82. A fifth oxide film 85 is formed on the entire surface to open a portion of a surface of the body 83 of the thin film transistor, and a Vcc line 86 is formed in contact with the exposed or opened body 83 of the thin film transistor. The oxide film 85 and Vcc line 86 are explained in more detail later to show contact holes with reference to FIGS. 9k, 10k, and 11k and 91, 101 and 111.

A sixth oxide film 87 is formed on the entire surface of the semiconductor substrate 61 inclusive of the Vcc line 86. A first tungsten plug 88 is formed having substantially the same height with the surface of the sixth oxide film 87 and connected to the first impurity region 69 and the third gate electrode 81. A Vss line 89 of a first aluminum is formed selectively on the sixth oxide film 87 connected to the first tungsten plug 88. A seventh oxide film 90 is formed on the entire surface of the semiconductor substrate 61 to open a portion of a surface of the Vss line 89. A second tungsten plug 91 is formed above the opened Vss line 89, and a bit line 92 of a second aluminum is formed over the seventh oxide film 90 and connected to the second tungsten plug 91.

Figure 9A:
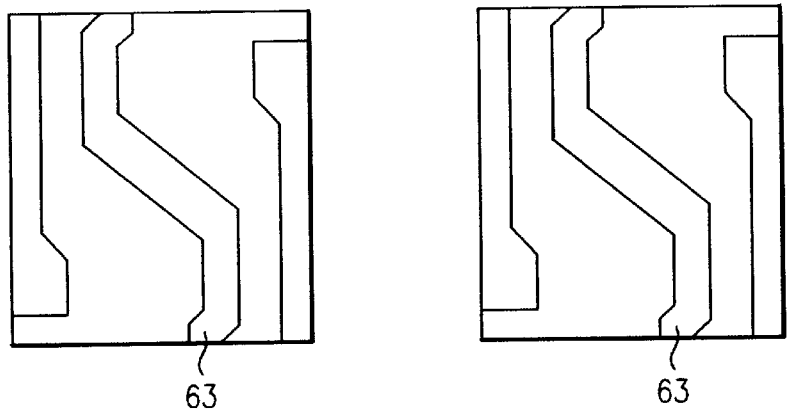
FIGS. 9a–9p illustrate layouts showing the steps of a method for fabricating an SRAM cell in accordance with a preferred embodiment of the present invention.
Figure 9P:
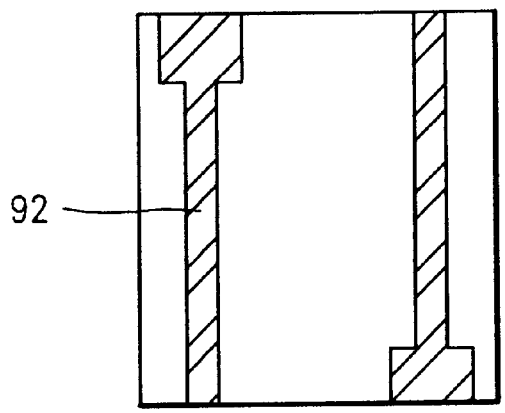
Figure 9P:
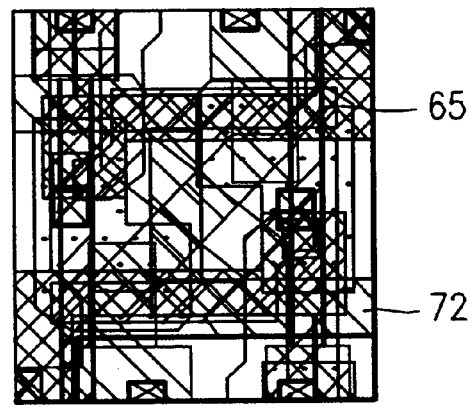
Figure 10A:
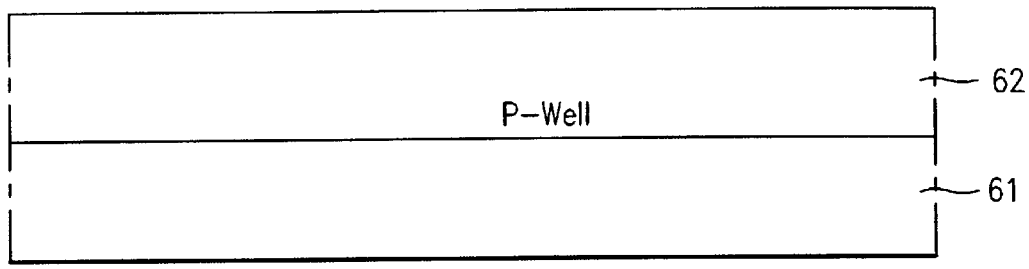
FIGS. 10a–10p illustrate sections across lines VI—VI in FIGS. 9a–9p showing the steps of the method for fabricating an SRAM cell in accordance with the preferred embodiment of the present invention.

A method for fabricating an SRAM cell in accordance with a preferred embodiment of the present invention will be explained with reference to the attached drawings. FIGS. 9a–9p illustrate layouts showing the steps of a method for fabricating an SRAM cell in accordance with the preferred embodiment of the present invention. FIGS. 10a–10p show cross-sectional views across lines VI—VI in FIGS. 9a–9p, and FIGS. 11a–11p show cross-sectional views across lines VII—VII in FIGS. 9a–9p.

Figure 11A:
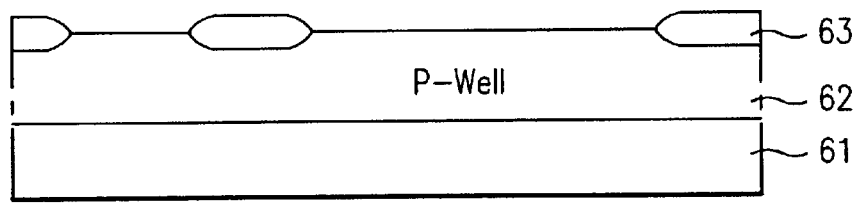
FIGS. 11a–11p illustrate sections across lines VII—VII in FIGS. 9a–9p showing the steps of the method for fabricating an SRAM cell in accordance with the preferred embodiment of the present invention.

Referring to FIGS. 9a, 10a, and 11a, a p-well 62 is formed in a semiconductor substrate 61, and active regions spaced predetermined distances apart and field oxide films 63 isolating the active regions are defined on the surface of the p-well 62 with a LOCOS (LOCal Oxidation of Silicon) process. Though not shown, the LOCOS process forms an initial oxide film and a nitride film on the p-well 62 and selectively removes the nitride film with photolithography and etching process, to define the active regions and the field regions. The active regions, portions of which will be used as device regions, are formed to have predetermined distances. The field regions are injected with field ions, the field oxide films 63 are formed by LOCOS process, and the nitride film and the initial oxide film are removed.

Figure 9B:
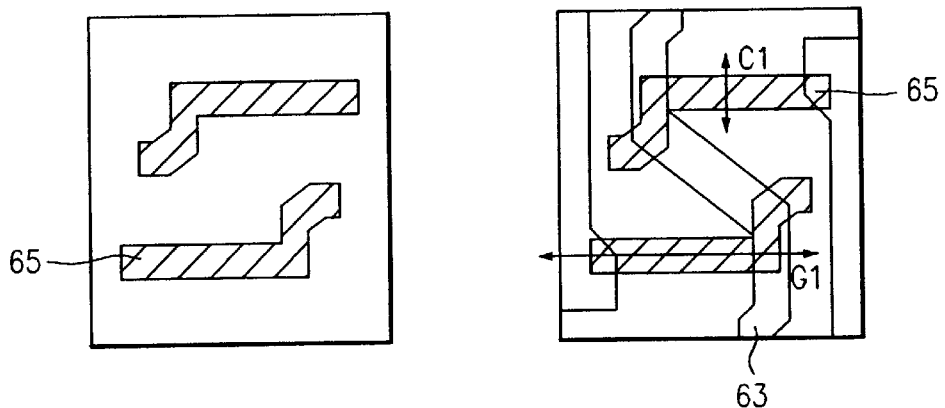
Figure 9D:
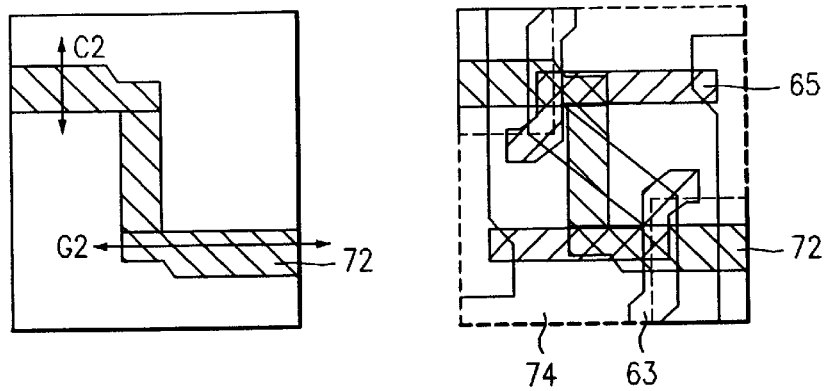
Figure 10B:
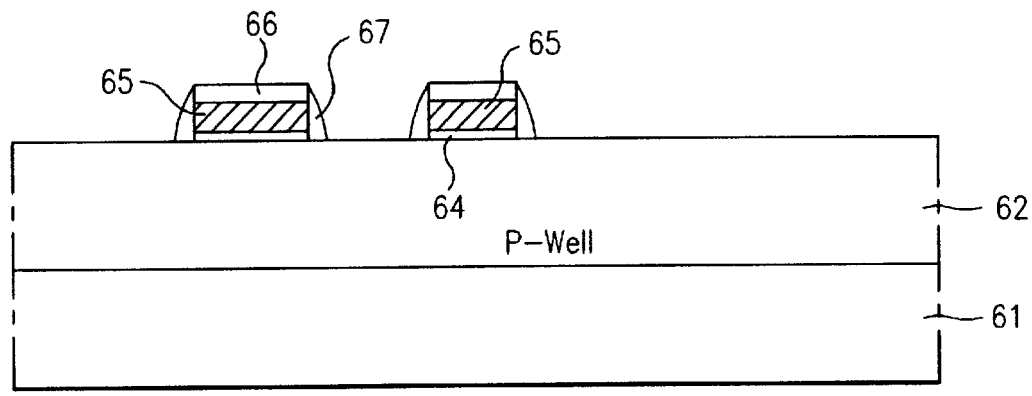
Figure 11B:
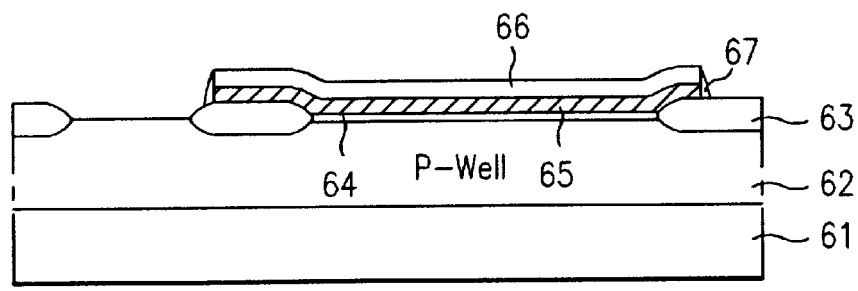

Referring to FIGS. 9b, 10b, and 11b, a gate oxide film 64 is formed on the active region, a first polysilicon for forming a gate electrode is formed on the entire surface of the p-well 62 inclusive of the first gate oxide film 64 to a predetermined thickness, and a first cap oxide film 66 is formed on the first polysilicon. The first cap oxide film 66, the first polysilicon, and the first gate insulating film 64 are selectively removed by photolithography and etching to form first gate electrodes 65 of a drive transistor. A first oxide film is formed on the entire surface of the p-well 62 inclusive of the first gate electrodes 65 and etched back to form first sidewall oxide films 67 at both sides of the first gate electrodes 65. FIG. 9b also shows the channel direction C1 of the first gate electrode 65 (which is the same as the channel direction C2 of the access transistors to be shown in FIG. 9d. Also, the gate direction is shown in FIGS. 9b and 9d as G1 and G2, respectively. Here directions G1 and G2 are the same.

Figure 9C:
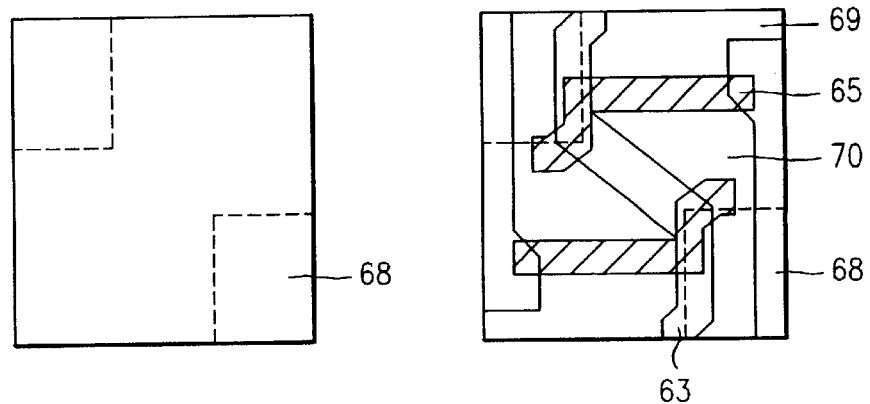
Figure 10C:
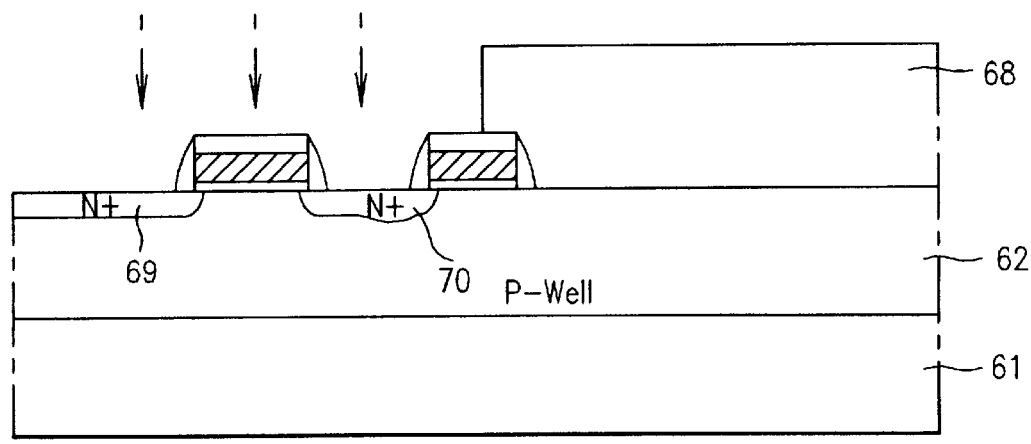
Figure 11C:
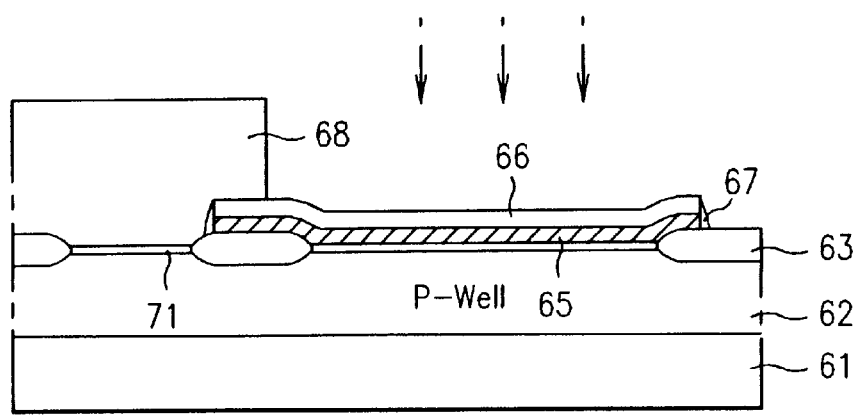

Referring to FIGS. 9c, 10c, and 11c, first photoresist 68 is coated on the entire surface of the p-well 62 inclusive of the first gate electrodes 65, and subjected to exposure and development to pattern the first photoresist 68. Impurity ions (for example P) are doped using the patterned first photoresist 68 as a mask, to form first and second impurity diffused regions 69 and 70, which are source/drain regions, at a surface portions of the p-well 62 on both sides of the first gate electrode 65. Thus, two spaced drive transistors are formed. In the patterning, a portion of the first photoresist 68 is patterned to overlap with the first gate electrode 65.

Figure 10D:
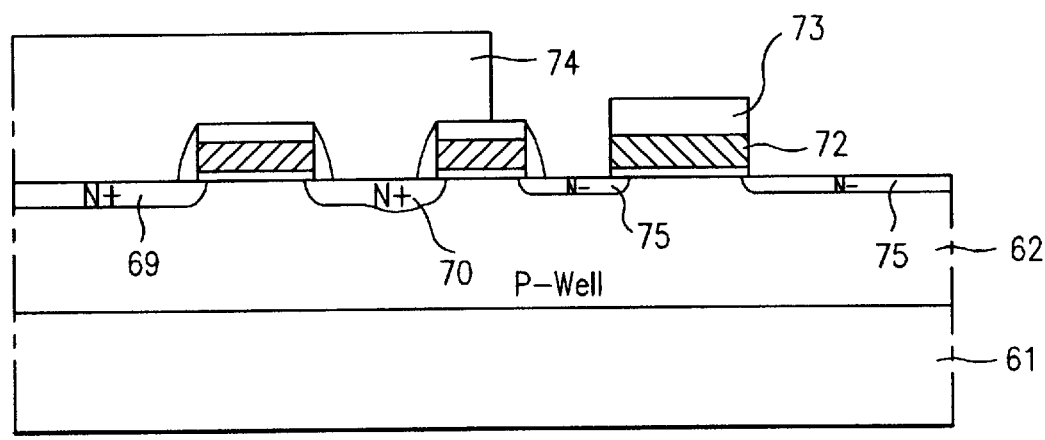
Figure 11D:
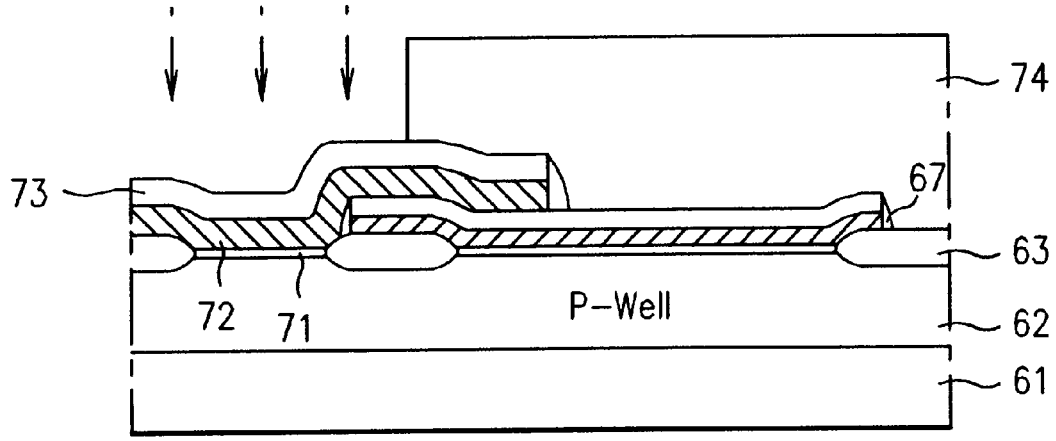

Referring to FIGS. 9d, 10d, and 11d, the first photoresist 68 is removed, and a second gate oxide film 71 is formed on a portion of the active region of the p-well 62. The second gate oxide film 71, a second polysilicon, and a second cap oxide film 73 are formed in succession, and subjected to photolithography and etching to selectively remove the second cap oxide film 73, the second polysilicon, and the second gate oxide film 71 to form second gate electrodes 72 of two access transistors. In this case, the second gate electrodes 72 are preferably formed as a common gate line where the two gate electrodes are connected to each other by an interconnection line INT. The two gate electrodes are preferably formed by a single process (as shown in FIG. 9d), or as individual gate electrodes parallel to each other and the first gate electrodes 65 of the drive transistor (not shown). Second photoresist 74 is coated on the entire surface over the p-well 62 inclusive of the second gate electrode 72, and subjected to exposure and development to pattern the second photoresist 74. Impurity ions are lightly doped using the patterned second photoresist 74 as a mask, to form LDD (Lightly Doped Drain) regions 75 at surface portions of the p-well 62 on both sides of the second gate electrodes 72. In this instance, one impurity region of the first gate electrode 65 is also lightly doped with the impurity ions.

Figure 9E:
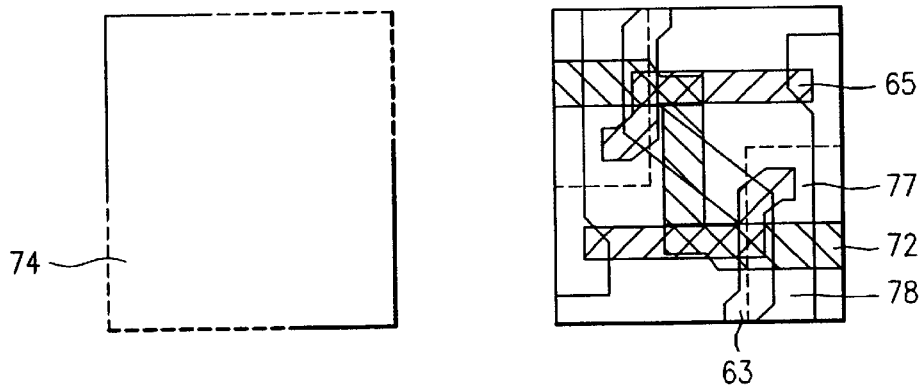
Figure 10E:
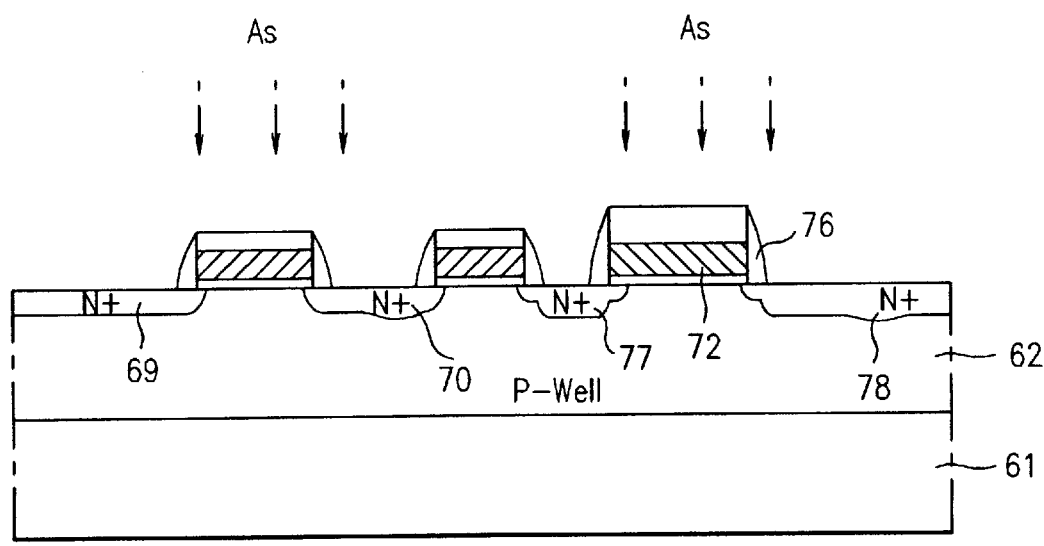
Figure 11E:
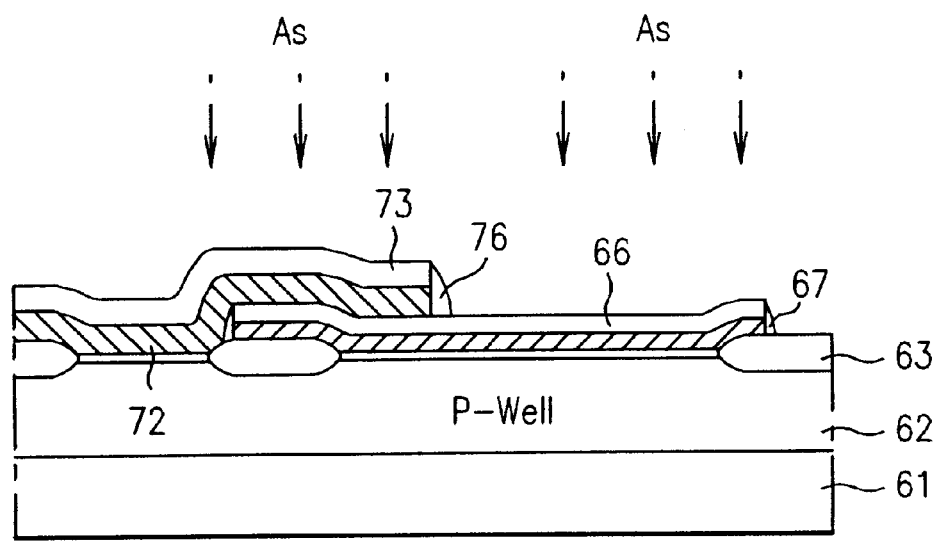

Referring to FIGS. 9e, 10e, and 11e, the second photoresist 74 is removed, and a second oxide film is formed on the entire surface over the p-well 62 inclusive of the second gate electrode 72 and etched back to form second sidewall oxide films 76 on both sides of the second gate electrode 72. The entire surface over the semiconductor substrate 61 is heavily doped with impurity ions (for example, As) using the second gate electrode 72 and the second sidewall oxide films 76 as masks to form third and fourth impurity regions 77 and 78 connected to the LDD regions 75 on both sides of the second gate electrode 72. Thus, two access transistors are formed. Herein, the drive transistors and the access transistors are overlappingly formed with their channels arranged in the same direction.

Figure 9F:
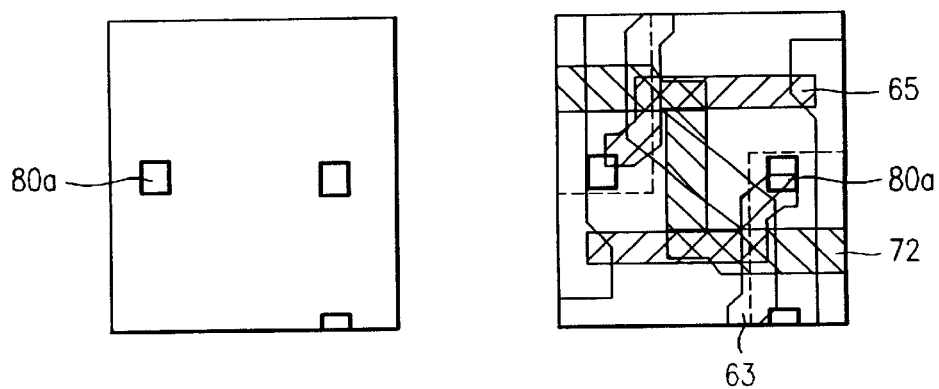
Figure 10F:
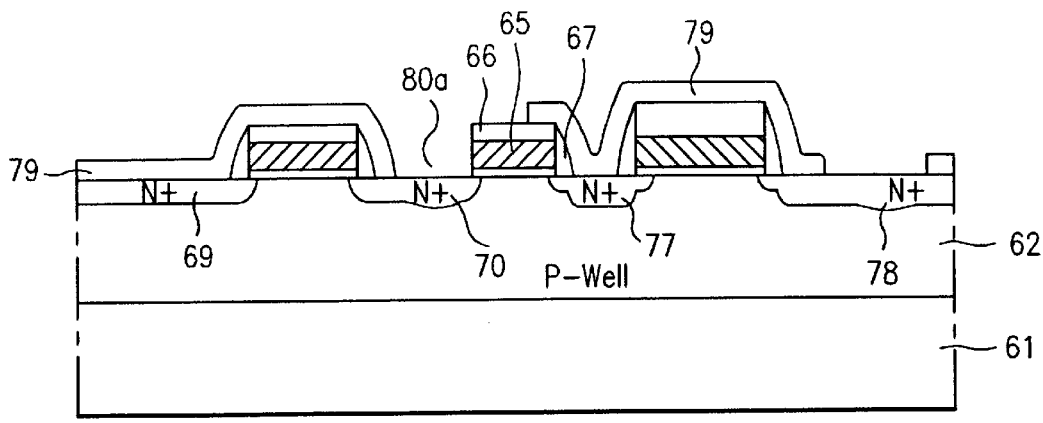
Figure 11F:
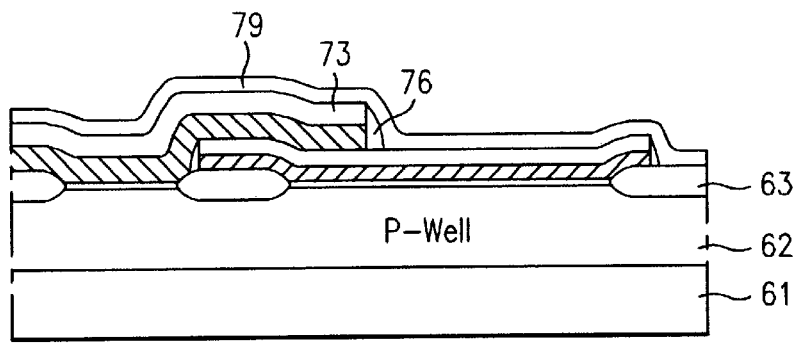

Referring to FIGS. 9f, 10f, and 11f, a third oxide film 79 is formed on the entire surface over the semiconductor substrate 61, and subjected to photolithography and etching to selectively remove the third oxide film 79 to open or expose a surface of each of the second and fourth impurity diffused regions 70 and 78 and the first cap oxide film 66, thus forming first contact holes 80a. In this instance, one side of the first sidewall oxide films 67 formed at sides of the first gate electrode 65 of the drive transistor is removed simultaneously with the selective removal of the third oxide film.

Figure 9G:
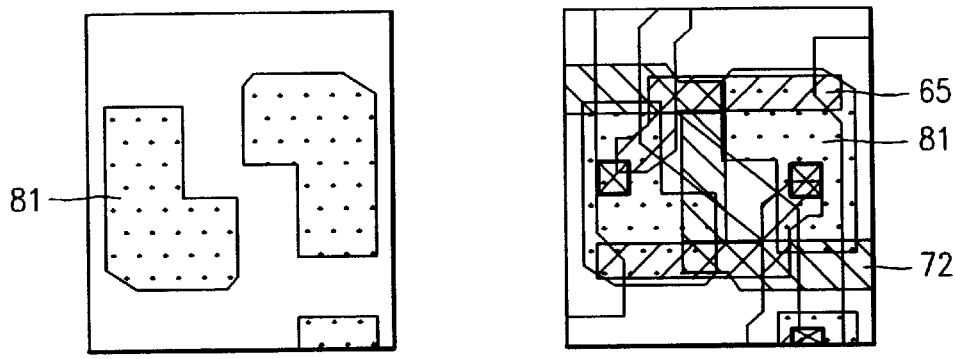
Figure 10G:
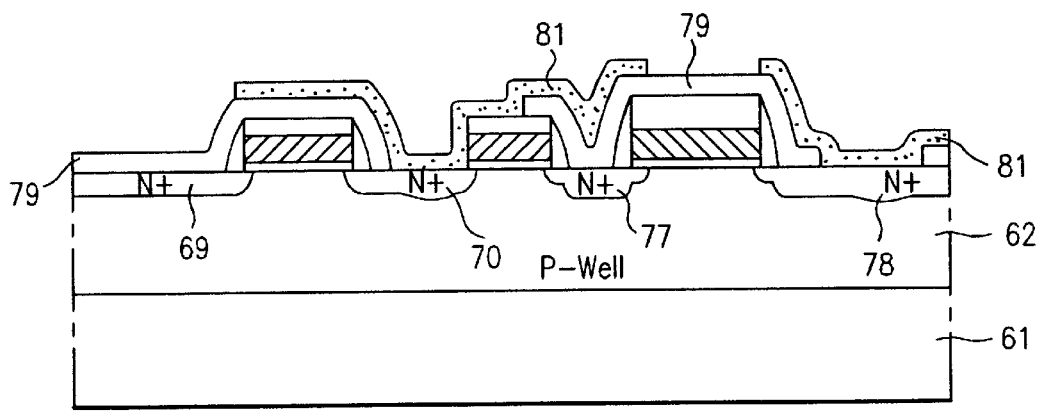
Figure 11G:
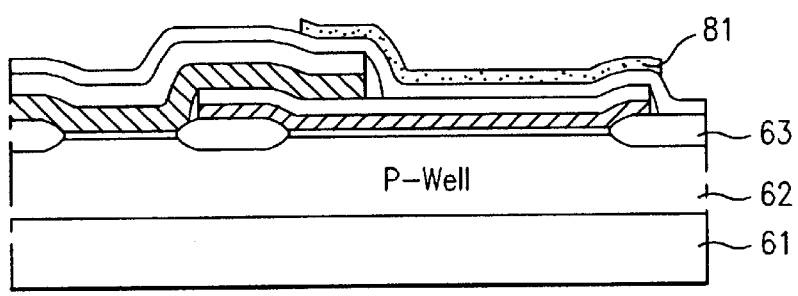

Referring to FIGS. 9g, 10g, and 11g, third polysilicon is formed on the entire surface over the semiconductor substrate 61 inclusive of the first contact holes 80a, and selectively removed only to leave the third polysilicon inside of the first contact holes 80a and on the second gate electrode adjoining to the first contact holes 80a to form third gate electrodes 81 of thin film transistors. In this instance, the third gate electrode 81 is formed to contact with a side of the first gate electrode 65 having one side of the first sidewall oxide films 67 removed therefrom.

Figure 9H:
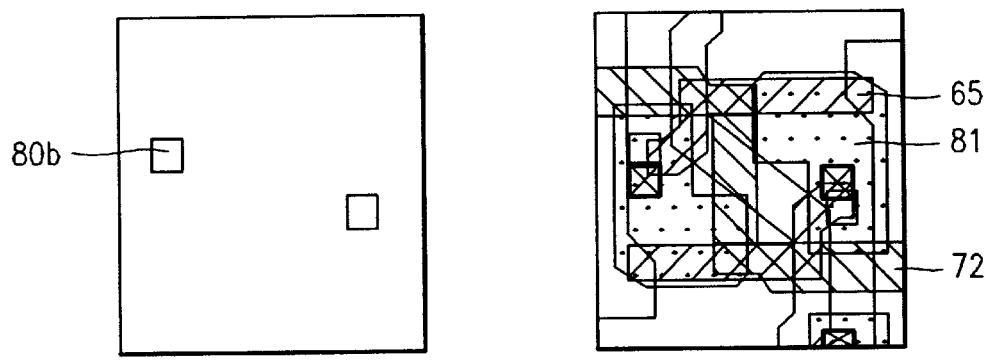
Figure 10H:
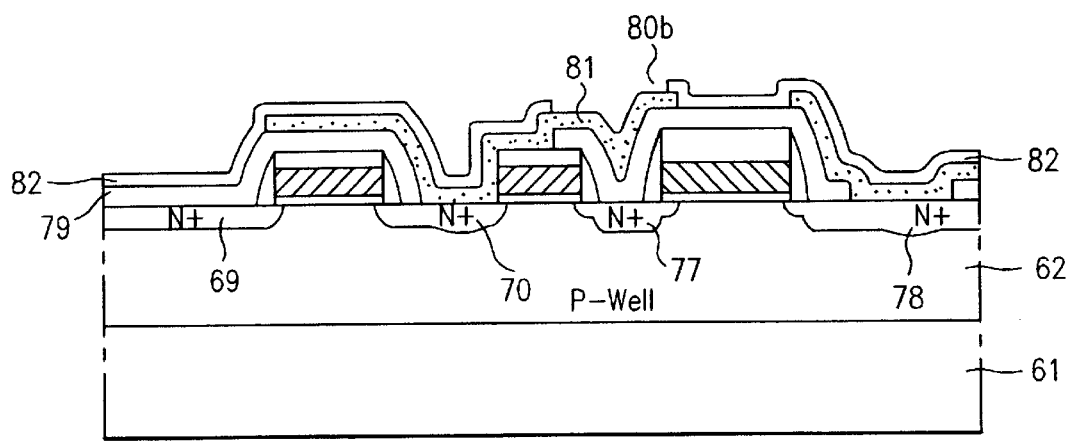
Figure 11H:
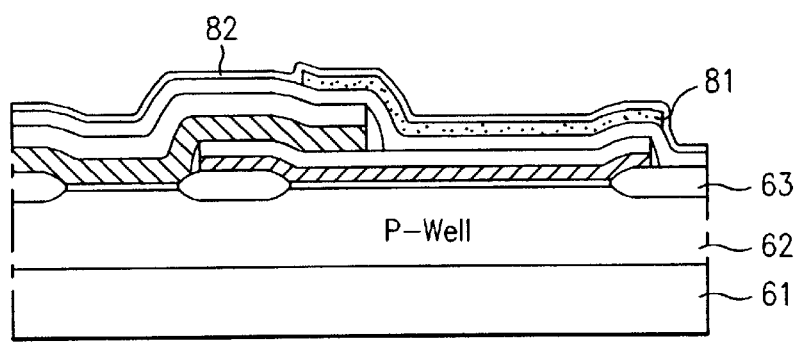

Referring to FIGS. 9h, 10h, and 11h, a fourth oxide film 82 is formed on the entire surface over the semiconductor substrate 61 inclusive of the third gate electrode 81, and subjected to photolithography and etching to selectively remove the fourth oxide film to open predetermined surfaces of the third gate electrode 81, thus forming second contact holes 80b.

Figure 9I:
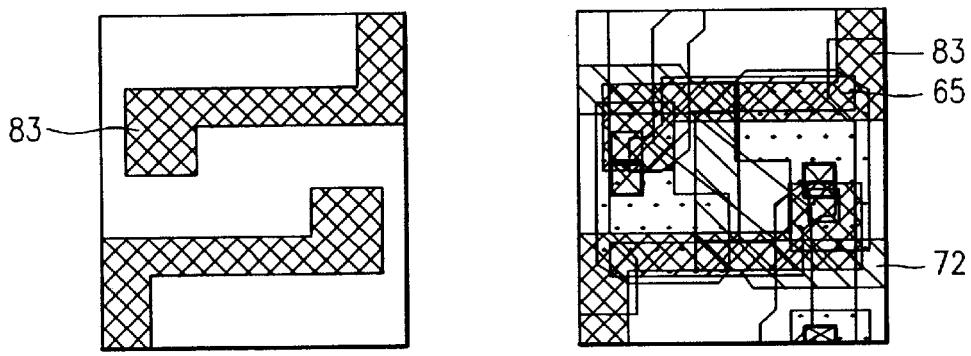
Figure 10I:
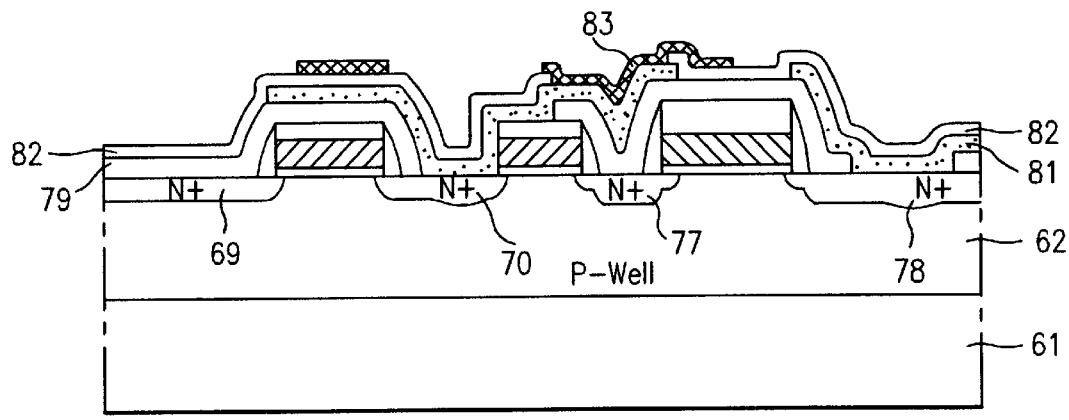
Figure 11I:
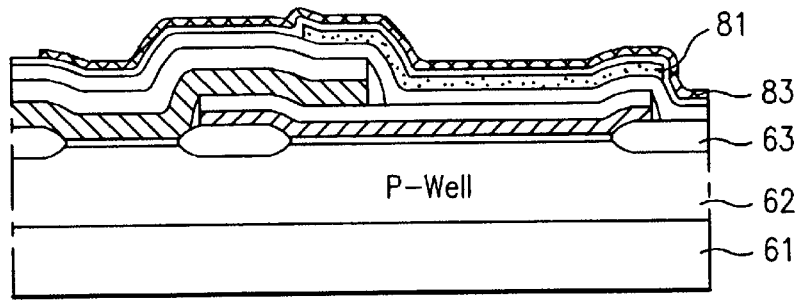

Referring to FIGS. 9i, 10i, and 11i, fourth polysilicon is formed on the entire surface over the semiconductor substrate 61 inclusive of the second contact holes 80b and subjected to photolithography and etching to selectively remove the fourth polysilicon. Thus, bodies (TFT active region) 83 of the thin film transistors are formed, which will be used as source, drain, and channel regions, on the exposed surfaces of the third gate electrodes 81 and on the fourth oxide film 82 adjoining the exposed surfaces. Alternatively, the thin film transistor may be replaced by a load device such as a polysilicon resistor suitable for an SRAM.

Figure 9J:
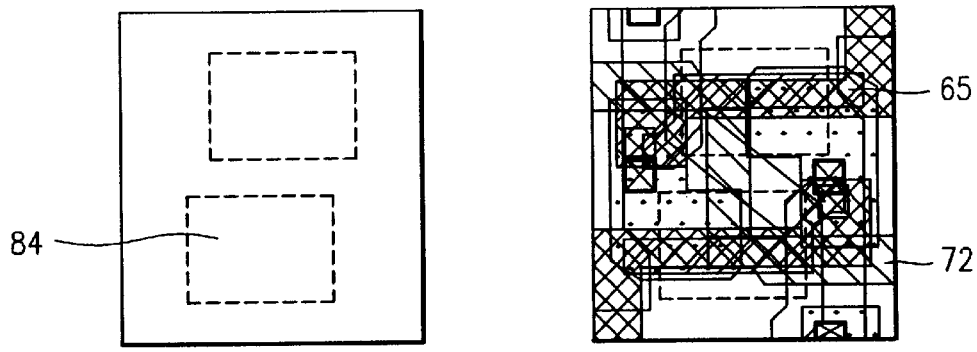
Figure 10J:
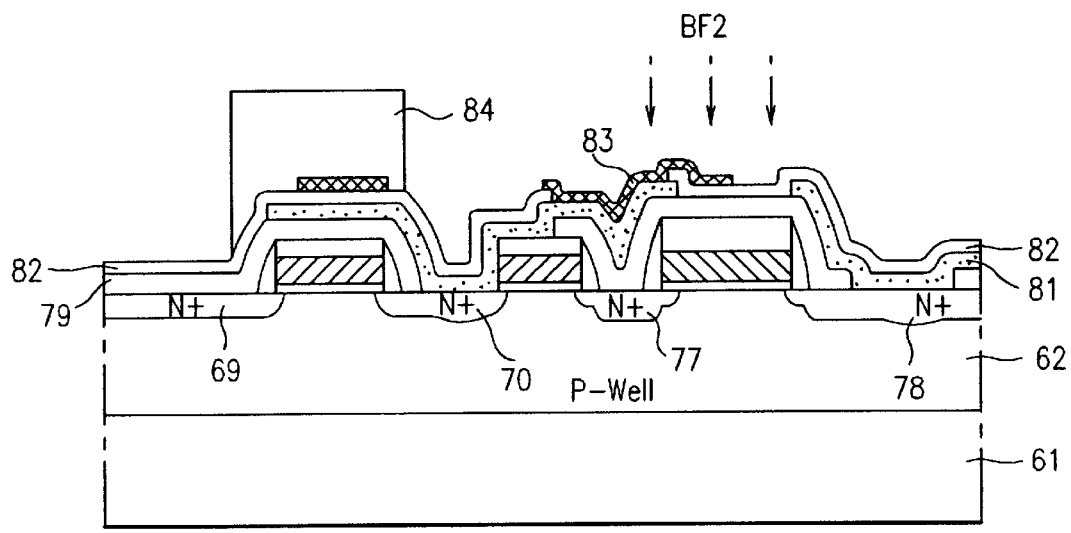
Figure 11J:
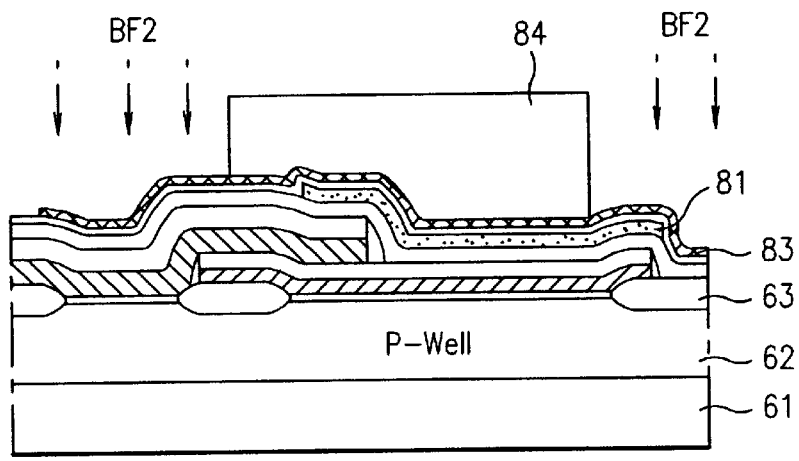

Referring to FIGS. 9j, 10j, and 11j, third photoresist 84 for use as an offset mask is coated on the entire surface over the semiconductor substrate 61 inclusive of the bodies 83 of the thin film transistors and subjected to exposure and development to pattern the third photoresist 84. P type impurity ions (for example, BF2) are injected into the entire surface of the semiconductor substrate 61 using the patterned third photoresist 84 as a mask to form a channel region, a source region, and a drain region of the third gate electrode 81 in each of the bodies 83 of the thin film transistors.

Figure 9K:
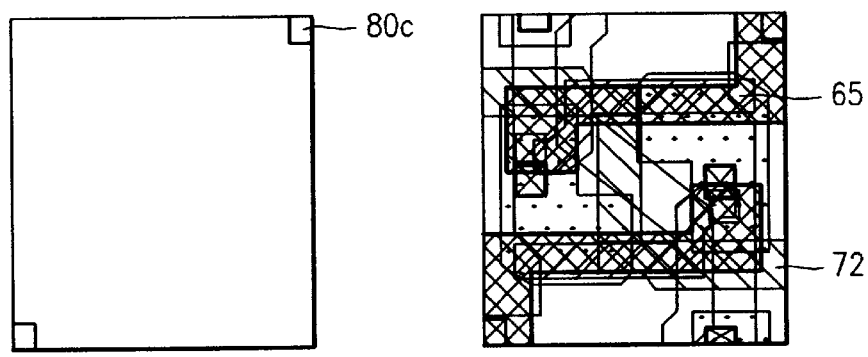
Figure 10K:
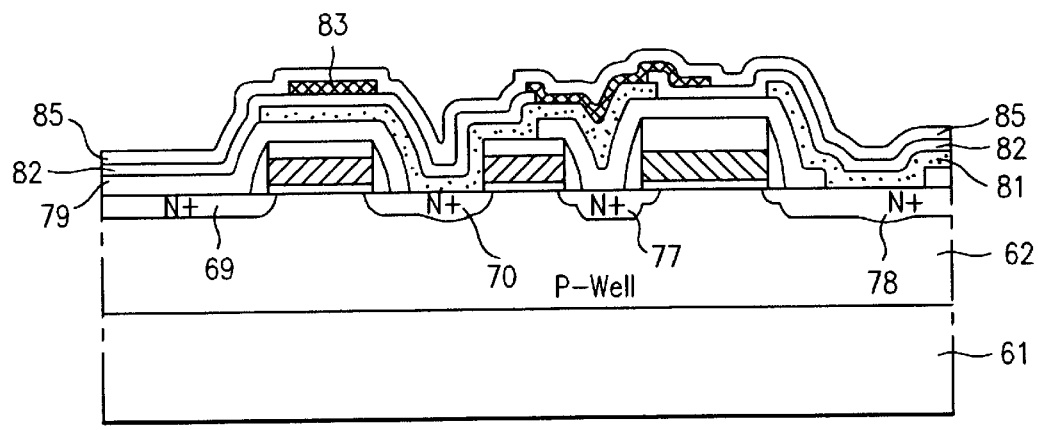
Figure 11K:
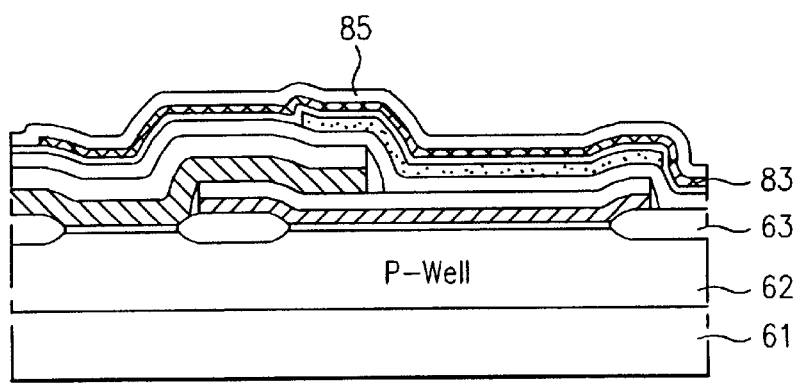

Referring to FIGS. 9k, 10k, and 11k, the third photoresist 84 is removed, and a fifth oxide film 85 is formed on the entire surface over the semiconductor substrate 61 inclusive of the exposed bodies 83 of the thin film transistors and selectively removed to expose a surface of the body 83 of each of the thin film transistors to form third contact holes 80c (FIG. 9k) therein.

Figure 9L:
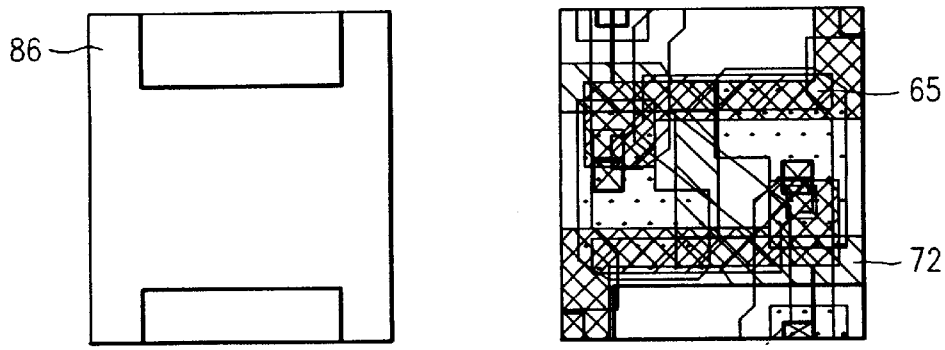
Figure 10L:
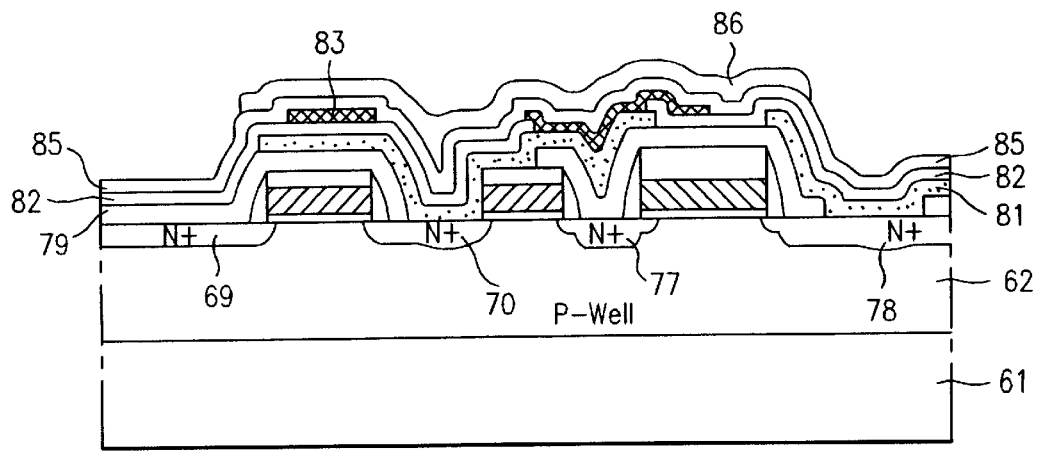
Figure 11L:
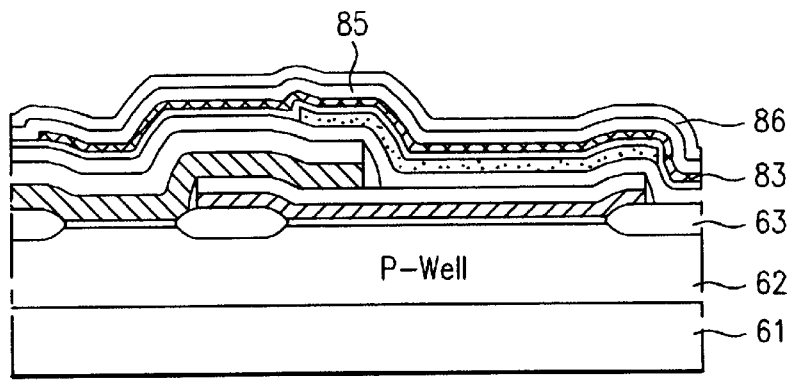

Referring to FIGS. 9l, 10l, and 11l, fifth polysilicon is formed on the entire surface over the semiconductor substrate 61 inclusive of the third contact holes 80c and subjected to photolithography and etching to selectively remove the fifth polysilicon to form a Vcc line 86 connected to the bodies 83 of the thin film transistors through the third contact holes 80c.

Figure 9M:
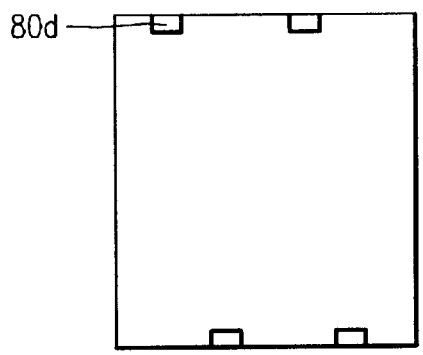
Figure 9M:
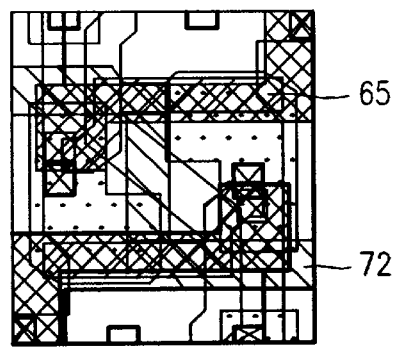
Figure 10M:
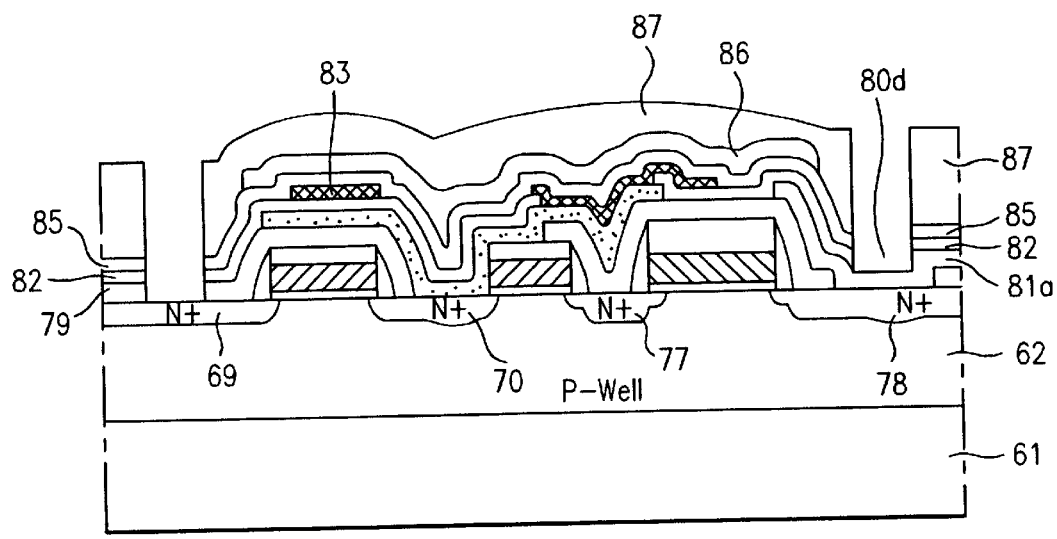
Figure 11M:
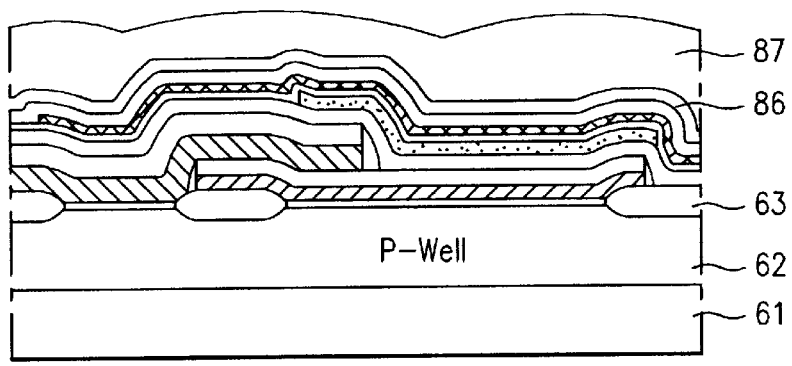

Referring to FIGS. 9m, 10m, and 11m, a sixth oxide film is formed on the entire surface over the semiconductor substrate 61. The sixth, fifth, fourth and third oxide films 87, 85, 82 and 79 are subjected to photolithography and etching to selectively remove the sixth, fifth, fourth and third oxide films 87, 85, 82 and 79 to expose predetermined surfaces of the third gate electrodes 81 on the fourth impurity diffused region 78 to form four fourth contact holes 80d, which will be used as contacts for bit lines and ground lines. The four fourth contact holes 80d, for two bit lines and two ground lines, are formed at opposite sides (FIG. 9m).

Figure 9N:
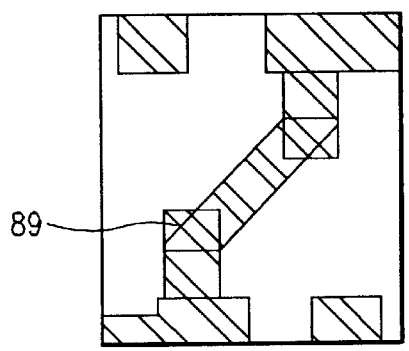
Figure 9N:
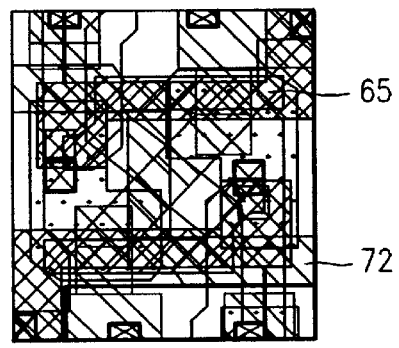
Figure 10N:
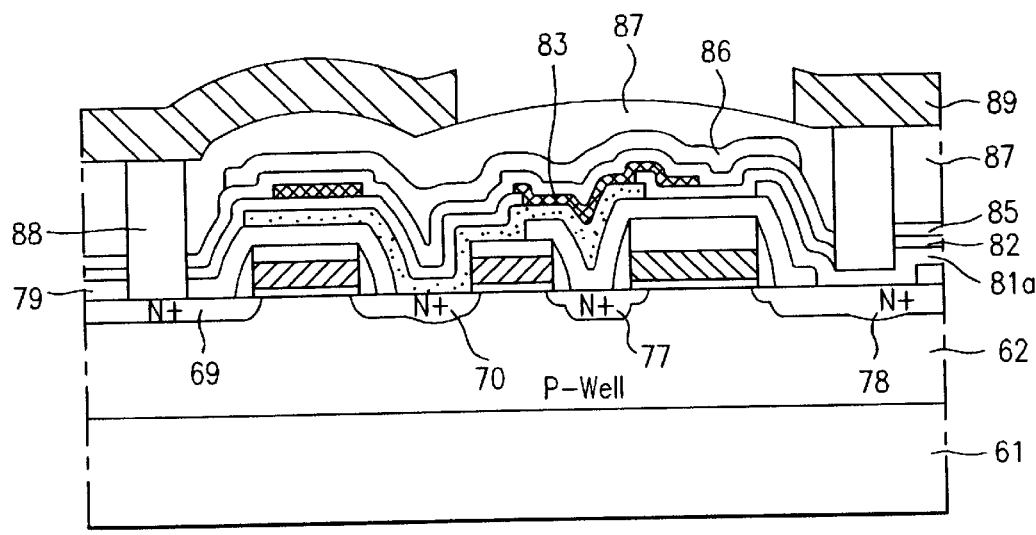
Figure 11N:
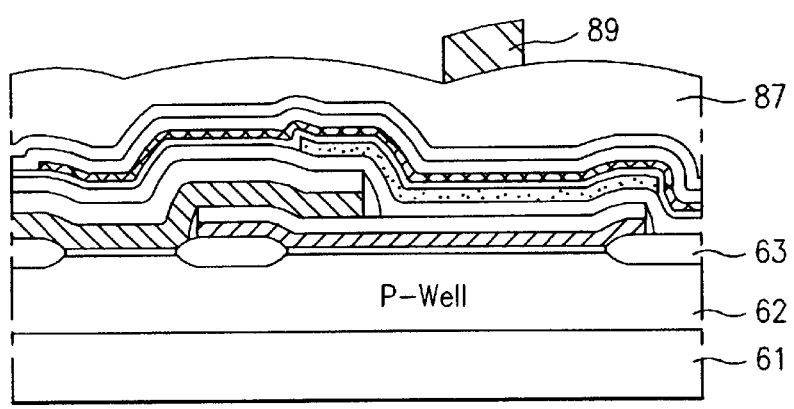

Referring to FIGS. 9n, 10n, and 11n, a first tungsten is deposited on the entire surface over the semiconductor substrate 61 inclusive of the fourth contact holes 80d and etched back, to form first tungsten plugs 88 in the fourth contact holes 80d. A first aluminum is deposited on the entire surface over the semiconductor substrate 61 inclusive of the first tungsten plugs 88 and selectively removed to leave the first aluminum on the first tungsten plugs 88 and on the sixth oxide film 87 adjoining the first tungsten plugs 88. Thus, Vss lines 89 is formed electrically connected to the two tungsten plugs 88 formed in the fourth contact holes 80d for contacting the two ground lines.

Figure 9O:
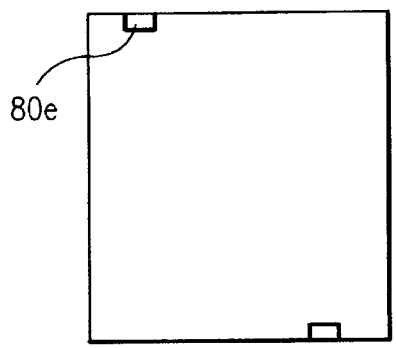
Figure 9O:
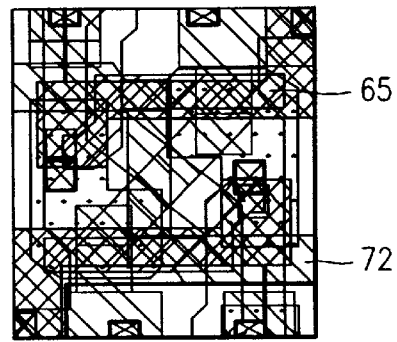
Figure 10O:
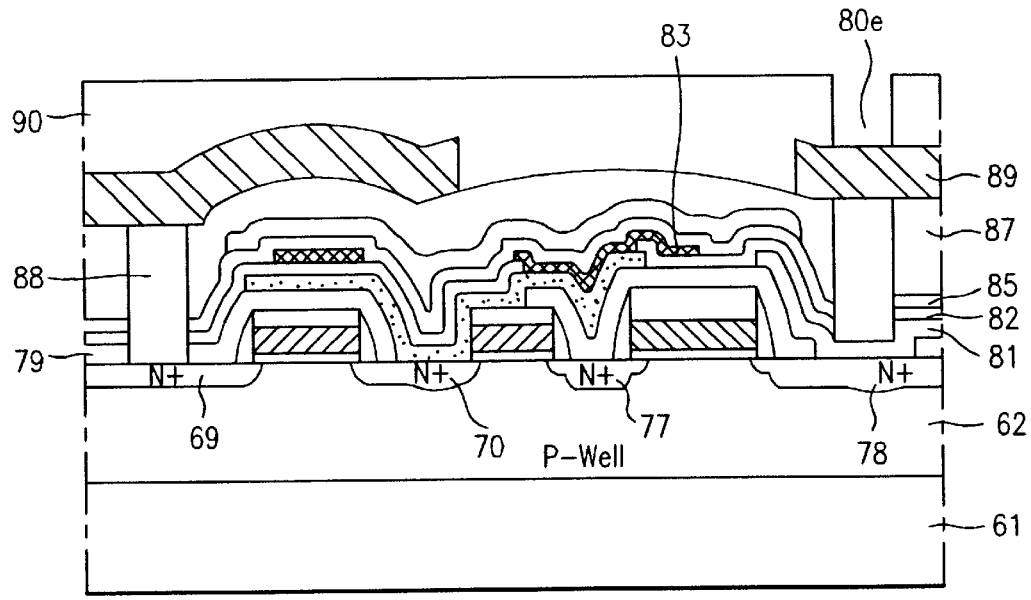
Figure 10P:
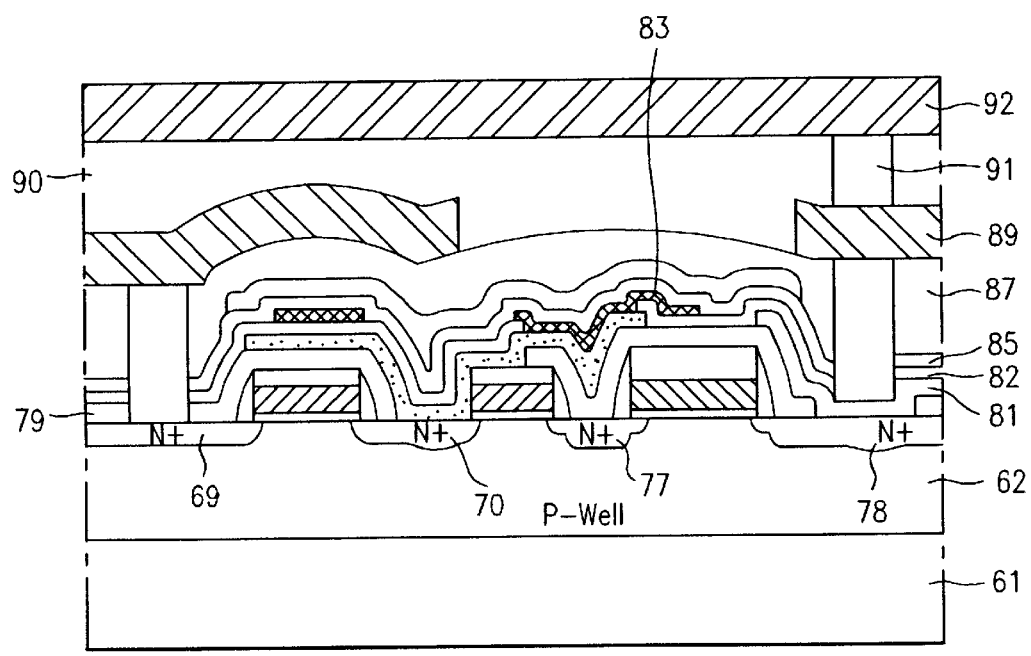
Figure 11O:
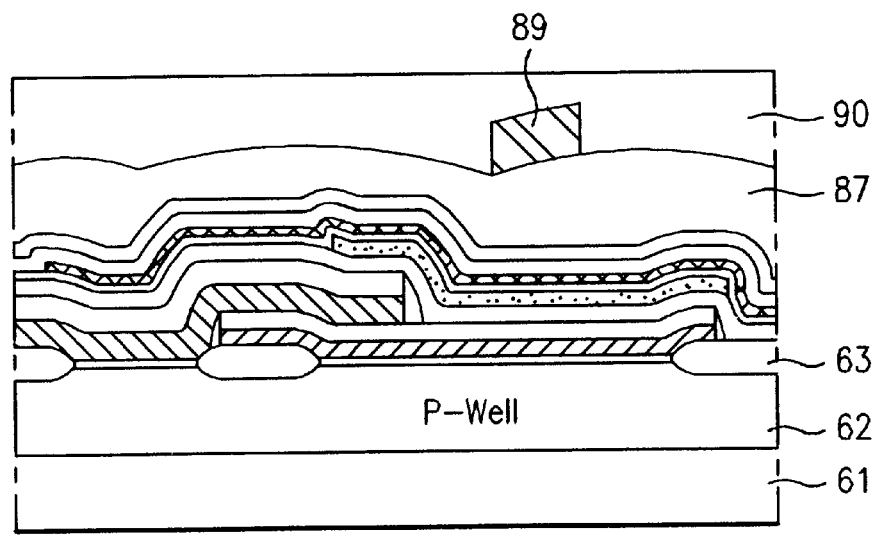

Referring to FIGS. 9o, 10o, and 11o, a seventh oxide film 90 is formed on the entire surface over the semiconductor substrate inclusive of the Vss lines 89, and subjected to photolithography and etching to selectively remove the seventh oxide film 90 to expose surfaces of the first tungsten plugs 88 formed in the fourth contact holes 80d for contacting the two bit lines, to form fifth contact holes 80e.

Figure 11P:
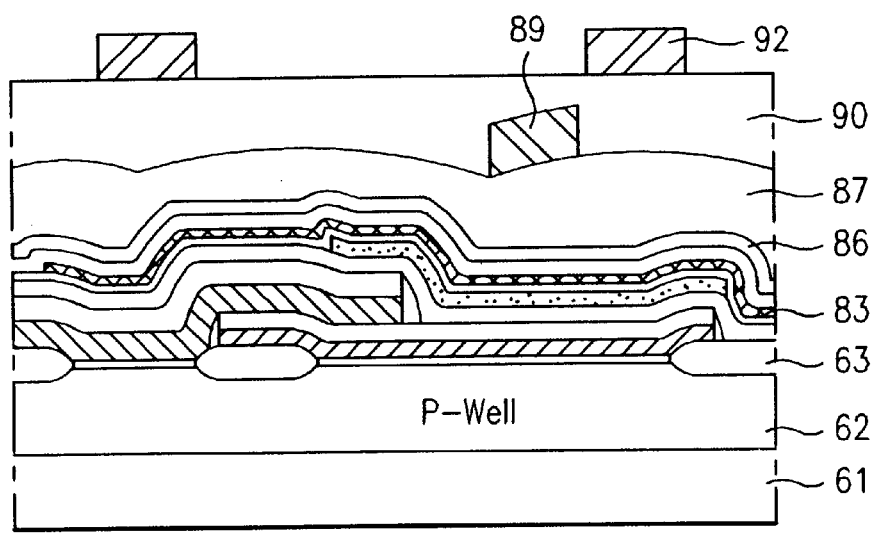

Referring to FIGS. 9p, 10p, and 11p, a second tungsten is deposited on the entire surface over the semiconductor substrate 61 inclusive of the fifth contact holes 80e and etched back, to form second tungsten plugs 91 in the fifth contact holes 80e electrically connected to the first tungsten plugs 88. Then, a second aluminum is deposited on the entire surface over the semiconductor substrate 61 inclusive of the second tungsten plugs 91 and selectively etched back by photolithography and etching, to form bit lines 92 electrically connected to the second tungsten plugs 91.

The SRAM cell and the method for fabricating the SRAM cell of the present invention has at least the following advantages. First, the overlap of the access transistor gates over the drive transistor gates improves a degree of integration and reduces a cell area. Second, the overlap of the thin film transistors, which have good ON/OFF characteristics, over the drive transistors and the access transistors improves a degree of integration and device characteristics. Third, the formation of the drive transistors and the access transistors with channels arranged in the same direction, and changing the cell shape from rectangle to square, facilitates the fabrication process. Fourth, the formation of the access transistor gates as a common gate line (see FIG. 9d) reduces a cell area while improving a degree of integration of the memory device.

It will be apparent to those skilled in the art that various modifications and variations can be made in the SRAM cell and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating an SRAM cell, the SRAM cell having first and second access transistors, first and second drive transistors, and first and second load resistors, wherein a first terminal of the first access transistor, a gate terminal of the second drive transistor and a first load resistor terminal are connected to one another to form a first cell node terminal, and a first terminal of the second access transistor, a gate terminal of the first drive transistor and a second load resistor terminal are connected to one another to form a second cell node terminal, the method comprising the steps of:

forming the first and second drive transistors each having impurity regions and a gate;

forming the first and second access transistors each having impurity regions and a gate overlapping portions of, and in parallel to the gates of the first and second drive transistors;

forming an insulating film having contact holes to the impurity regions of the first and second drive transistors; and, forming the first and second load resistors on the insulating film connected to the impurity regions of the first, and second drive transistors.

2. A method as claimed in claim 1, wherein sidewall insulating films are formed at both sides of the first and second access transistors and the first and second drive transistors.

3. A method as claimed in claim 1, wherein each of the impurity regions of the first and second access transistors and the first and second drive transistors includes a lightly doped region and a heavily doped region.

4. A method as claimed in claim 1, wherein each of the first and second load resistors includes a thin film transistor.

5. A method as claimed in claim 4, wherein the step of forming the first and second load resistors includes the steps of:

forming the first and second load resistors on the insulating film connected to the impurity regions of the first, and second drive transistors; and forming a second insulating film on the insulating film and the gate electrodes of the first and second load resistors.

6. A method as claimed in claim 4, wherein the gates and the active regions for the first and second load resistors are formed of polysilicon.

7. A method as claimed in claim 1, wherein the first access transistor and the first drive transistor, and the second access transistor and the second drive transistor are formed on first and second active regions separated from each other, respectively.

8. A method as claimed in claim 1, wherein the first and second drive transistors and the first, and second access transistors are formed to have channels arranged in substantially a same direction.

9. A method as claimed in claim 1, wherein gates of the first and second access transistors are formed as parallel gate lines separated from each other and respectively overlapped with portions of the gates of the first and second drive transistors.

10. A method as claimed in claim 1, wherein gates of the first and second access transistors are formed as a common line connected to each other and respectively overlapped to portions of, and in parallel to the gates of the drive transistors.

11. A method for fabricating an SRAM cell comprising the steps of:

providing a semiconductor substrate;

forming first and second active regions, each having a first region and a second region, on the semiconductor substrate, the first region being space from the second regions;

forming an isolating film for isolating the first and second active regions;

forming a first gate insulating film on the semiconductor substrate;

forming a first gate line on the first region of the first active region on the first gate insulating film and extended to a predetermined portion of the second region of the second active region;

forming a second gate line space a predetermined distance apart from the first gate line on the second region of the second active region on the first gate insulating film and extended to a predetermined portion on the first region of the second active region;

forming first impurity regions in the substrate on both sides of the first and second gate lines;

forming a third gate line on the first region of the second active region and the isolation film and extended to the second region of the first active region through the second gate insulating film;

forming second impurity regions in the substrate at both sides of the third gate line;

forming a first insulating film on an entire surface over the substrate having a first contact hole formed therein exposing a surface of the first impurity region between the first gate line and the second gate line and a second contact hole formed therein exposing a surface of the second impurity region at one side of the third gate line;

forming a fourth gate line on the first insulating film over the second active region to be connected to the first impurity region between the first gate line and the second gate line through the first contact hole;

forming a fifth gate line on the first insulating film over the first active region to be connected to the second impurity region on one side of the third gate line through the second contact hole;

forming a second insulating film on an entire surface over the substrate having third and fourth contact holes formed therein exposing predetermined portions of the fourth and fifth gate lines;

forming a first channel layer on the second insulating film connected to the fourth gate line through the third contact hole;

forming a second channel layer on the second insulating film connected to the fifth gate line through the fourth contact hole; and forming second conductive third impurity regions on surfaces of the first and second channel layers on both sides of the fourth and fifth gate lines.

12. A method for forming a memory cell comprising the steps of:

forming a first drive transistor having a first gate arranged over a semiconductor substrate in a first direction;

forming a second drive transistor, coupled to the first drive transistor at a first voltage source, having a second gate arranged over the semiconductor substrate in the first direction parallel to the first gate; and forming a first access transistor, coupled to the first and second drive transistors, having a third gate arranged in the first direction overlapping a portion of the first gate electrode of the first drive transistor;

forming a second access transistor, coupled to the first and second drive transistors, having a fourth gate arranged in the first direction overlapping a portion of the second gate electrodes of the second drive transistor;

forming a first load device coupled to the first drive transistor and to a second voltage source; and forming a second load device coupled to the second drive transistor.

* * * * *